(12) United States Patent
Yamamoto et al.

(10) Patent No.: US 6,208,419 B1
(45) Date of Patent: Mar. 27, 2001

(54) METHOD OF AND APPARATUS FOR BONDING LIGHT-EMITTING ELEMENT

(75) Inventors: Kiyohumi Yamamoto; Hiroshi Maeda; Satoshi Mino; Kazuhiro Nishida, all of Minamiashigara (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/438,062

(22) Filed: Nov. 10, 1999

(30) Foreign Application Priority Data

Nov. 18, 1998 (JP) .................................. 10-328111
Mar. 29, 1999 (JP) .................................. 11-087084
May 26, 1999 (JP) .................................. 11-050901

(51) Int. Cl.⁷ .................................................. G01B 11/00
(52) U.S. Cl. ............................................................ 356/400
(58) Field of Search ................................... 359/399, 400

(56) References Cited

U.S. PATENT DOCUMENTS

| | | | |
|---|---|---|---|
| 4,200,393 | * | 4/1980 | Suzuki et al. ......................... 356/73 |
| 4,772,123 | * | 9/1988 | Radner ................................. 356/153 |
| 5,278,634 | * | 1/1994 | Skunes et al. ....................... 356/400 |
| 5,757,503 | * | 5/1998 | Brady et al. ......................... 356/400 |
| 5,907,405 | * | 5/1999 | Mizutani et al. .................... 356/399 |

FOREIGN PATENT DOCUMENTS

| | | | |
|---|---|---|---|
| 6-216170 | 8/1994 | (JP) | .............. H01L/21/52 |
| 6-334022 | 12/1994 | (JP) | .............. H01L/21/68 |
| 7-43112 | 2/1995 | (JP) | .............. G01B/11/00 |

* cited by examiner

*Primary Examiner*—Frank G. Font
*Assistant Examiner*—Phil Natividad
(74) *Attorney, Agent, or Firm*—Sughrue, Mion, Zinn, Macpeak & Seas, PLLC

(57) ABSTRACT

A bonding apparatus has a probe for causing an LED chip to emit light before the LED chip is bonded on a board, an imaging system for recognizing the center of a light-emitting area of the LED chip and recognizing coordinates of a contour reference point of the LED chip with respect to the recognized center of the light-emitting area, and a light-emitting-element holding mechanism for positioning the LED chip in a bonding position on the board based on the recognized coordinates of the contour reference point. The center of the light-emitting area of the LED chip can be positioned highly accurately in a desired position on the board without being adversely affected by variations in the contour dimensions of the LED chip.

12 Claims, 26 Drawing Sheets

F I G. 15
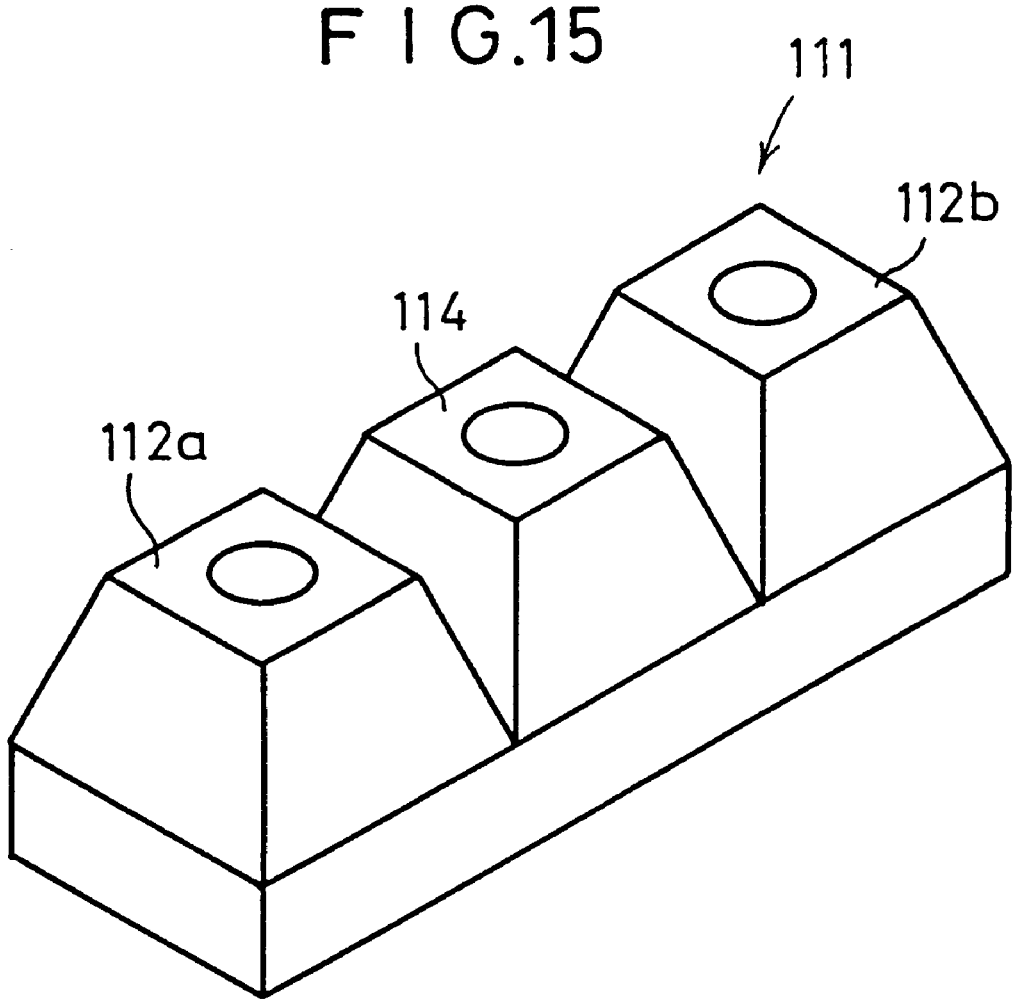

METHOD OF AND APPARATUS FOR BONDING LIGHT-EMITTING ELEMENT

BACKGROUND OF THE INVENTION

1. Field of the Invention

The present invention relates to a method of and an apparatus for bonding a light-emitting element in a predetermined position on a board.

2. Description of the Related Art

Generally, a linear array of light-emitting elements such as laser diodes, light-emitting diodes, or the like is used as a light source for image reading and outputting (recording) applications. For example, as shown in FIG. 28 of the accompanying drawings, an LED array 1 comprises a plurality of LED chips (light-emitting elements) 3 mounted on a board 2 at equally spaced intervals and arranged in a linear pattern extending in one direction. The LED chips 3 are bonded on the board 2 by silver paste, with gold wires 4 extending from the respective LED chips 3.

The LED array is required to have the LED chips 3 aligned highly accurately on the board 2 so that the central light-emitting regions of the LED chips 3 will be spaced at equal distances. One known die bonder designed to meet such a requirement is disclosed in Japanese laid-open patent publication No. 6-216170, for example. In the disclosed die bonder, upper and lower solid-state imaging devices are moved to a position between a semiconductor device and a workpiece to which the semiconductor device is to be joined. The upper solid-state imaging device captures the image of a mark on the semiconductor device, whereas the lower solid-state imaging device captures the image of a mark on the workpiece. A processing controller calculates the relative positional relationship between the semiconductor device and the workpiece based on detected signals from the upper and lower solid-state imaging devices. The relative positional relationship between the semiconductor device and the workpiece is adjusted on the basis of the calculated data, and then the semiconductor device is bonded to the workpiece.

On an LED chip, its central light-emitting area and the center of an alignment mark or a contour thereof are usually positionally misaligned with each other. Therefore, even if the LED chips are positioned relatively to the board by aligning the alignment marks of the LED chips with each other, a possible misalignment of the central light-emitting areas of the LED chips cannot effectively be avoided.

When efforts are made to recognize the centers of the contours of the LED chips which are less misaligned with the central light-emitting areas thereof, since the contours of the LED chips tend to vary from chip to chip to a relatively large extent, the centers of the contours of the LED chips are liable to be recognized in error. For this reason, it is difficult to accurately position the central light-emitting regions of the LED chips, resulting in a failure to construct a highly accurate LED array.

Japanese laid-open patent publication No. 7-43112 discloses a method of detecting a light-emitting spot of a light-emitting element and an apparatus for positioning such a light-emitting element. According to the disclosed arrangement, when a semiconductor laser chip is attracted by a suction nozzle and fed to a positioning location, an electric current is supplied to the semiconductor laser chip to enable the semiconductor laser chip to emit light, and a CCD camera positioned in confronting relation to the light-emitting area of the semiconductor laser chip captures an image of the semiconductor laser chip. The captured image is supplied from the CCD camera to a controller, which detects the position and orientation of the semiconductor laser chip based on the supplied image. Based on the detected position and orientation, the controller then controls the suction nozzle to correct the attitude of the semiconductor laser chip.

The principles of the disclosed invention are, however, based on the configurations of semiconductor laser chips, and are not applicable to LED chips whose light-emitting areas are of a comparatively complex shape. In addition, whereas the light emission of a semiconductor laser chip can easily be detected while the semiconductor laser chip is being attracted because the attracted surface of the semiconductor laser chip is different from the light-emitting surface thereof, it would be difficult to detect the center of the light-emitting area of an LED chip as the attracted surface of the LED chip is oriented in the same direction as the light-emitting surface thereof. Furthermore, when a probe would be applied to an LED chip to enable the LED chip to emit light, the probe would shield the light-emitting area of the LED chip, with the result that the center of the light-emitting area would not be detected with high accuracy.

Heretofore, the technique disclosed in Japanese laid-open patent publication No. 6-334022, for example, is known for bonding a plurality of LED chips on a board. According to the disclosed bonding process, an alignment mark on the board and alignment marks on the LED chips are read by individual cameras, and a biaxially movable stage, which supports the board and are movable along X- and Y-axes, is operated on the basis of positional information representing the read alignment marks, after which the LED chips are bonded on the board.

In the disclosed bonding arrangement, the bonding accuracy of the LED chips depends largely on the accuracy with which the biaxially movable stage is positionally measured. The position of the biaxially movable stage is usually measured by encoders or linear scales mounted on slide guides. However, since pitching and yawing displacements of the upper surface of the biaxially movable stage, which serves as a workpiece support, cannot be fully measured, the bonding accuracy of the LED chips tends to be lowered.

According to another bonding process, which is based on the above disclosed bonding process, the LED chips are simultaneously imaged by the camera, and then positionally corrected in order to equalize the distances between the alignment marks on the LED chips before the LED chips are bonded on the board.

However, the other bonding process is disadvantageous in that if the LED chips are widely spaced apart, then they cannot be simultaneously recognized. Another problem is that since the LED chips themselves are tiny pieces, it is difficult to apply alignment marks to the LED chips. In addition, the bonding process is not versatile as it can be applied to transparent boards only.

SUMMARY OF THE INVENTION

It is therefore a general object of the present invention to provide a method of and an apparatus for bonding light-emitting elements on a board while easily positioning the centers of the light-emitting areas of the light-emitting elements highly accurately on the board without being unduly affected by variations of the centers of the light-emitting areas and contours of the light-emitting elements.

A major object of the present invention is to provide a method of and an apparatus for bonding components by positioning the components highly accurately without being affected by spaced intervals between the components.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 15 is a perspective view of an LED chip of a three-chip structure;

DESCRIPTION OF THE PREFERRED EMBODIMENTS

Figure 1:
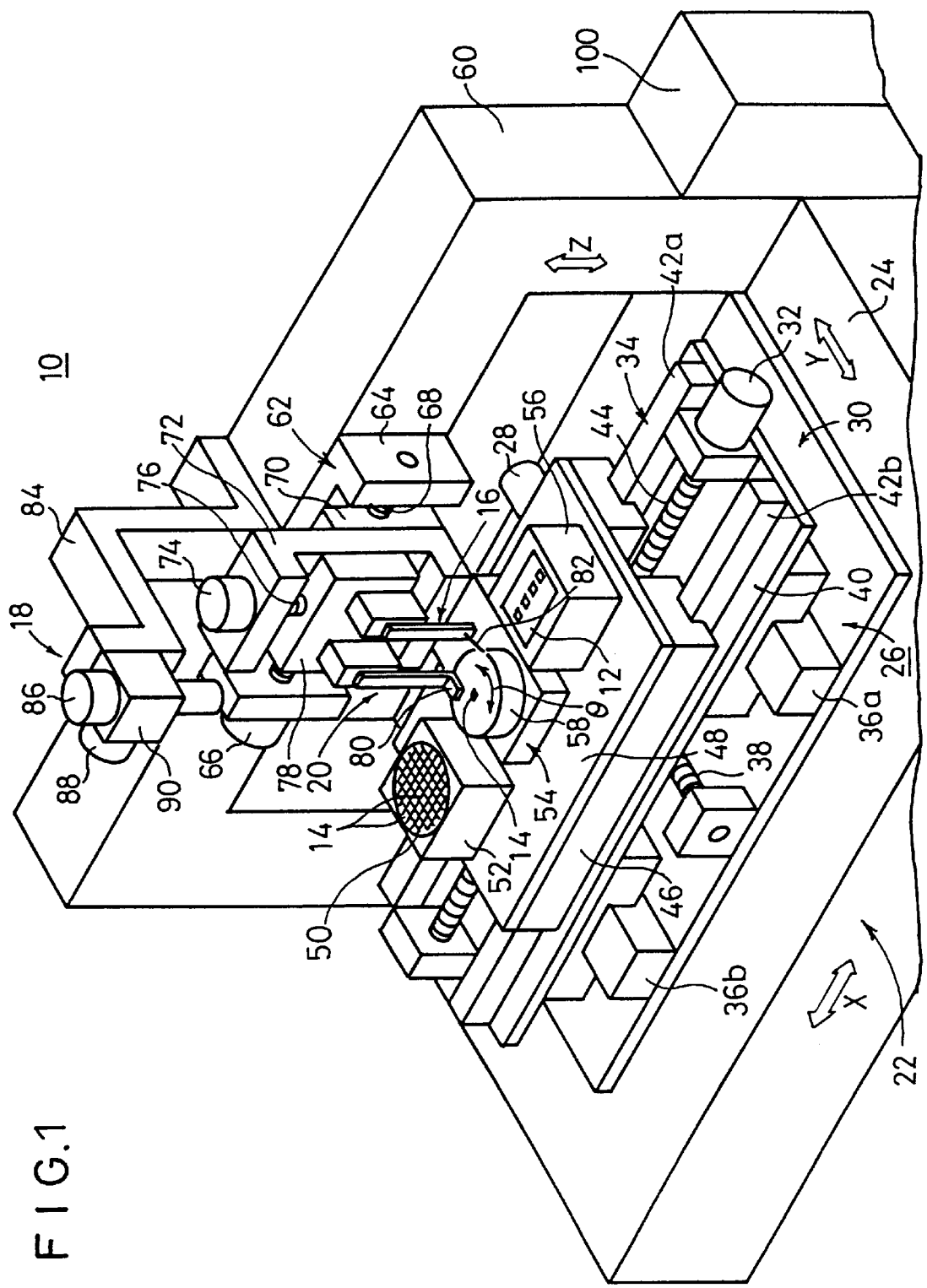
FIG. 1 is a perspective view of a bonding apparatus for carrying out a method of bonding a light-emitting element according to a first embodiment of the present invention.
Figure 2:
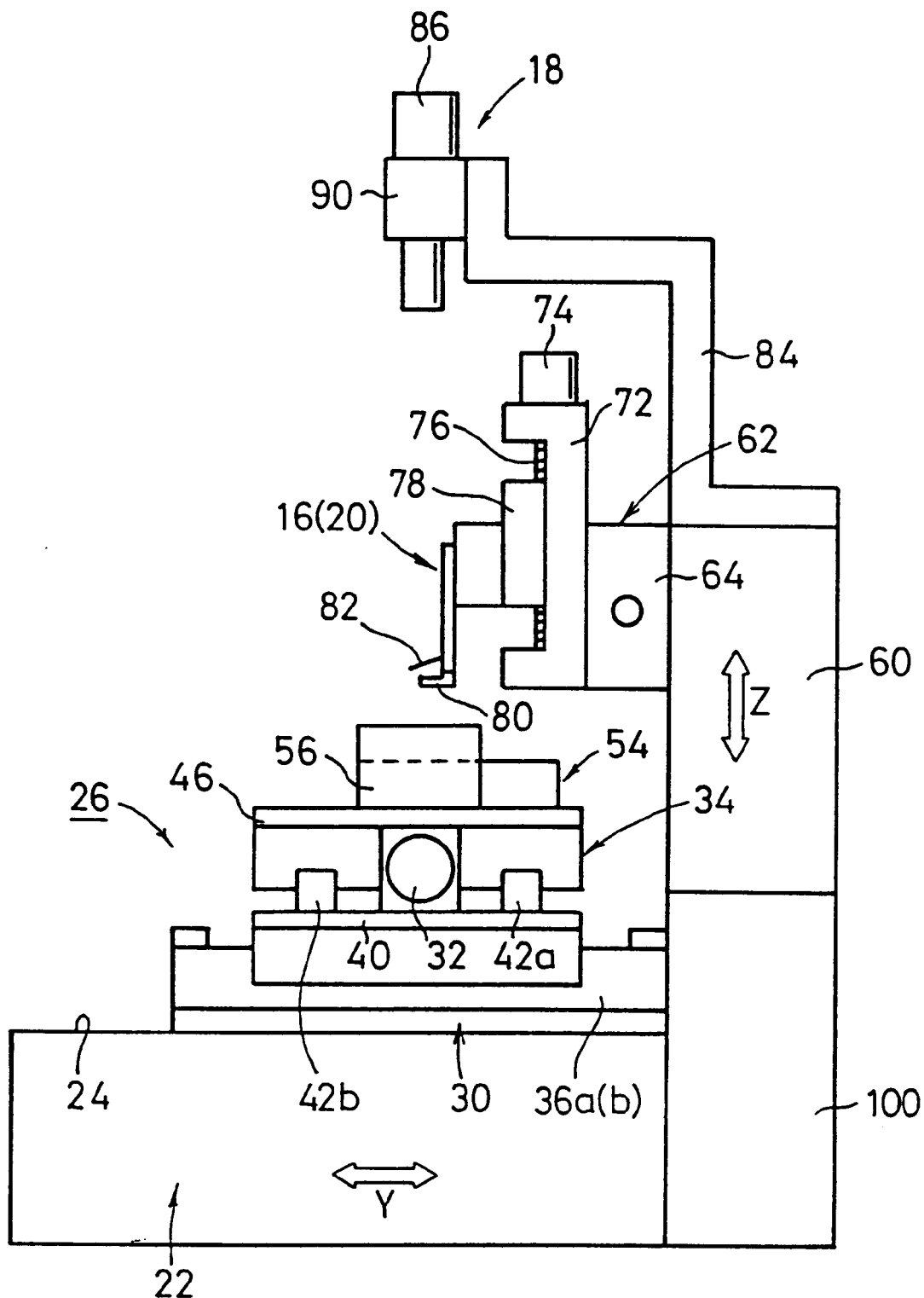
FIG. 2 is a side elevational view of the bonding apparatus shown in FIG. 1.

FIG. 1 shows in perspective a bonding apparatus 10 for carrying out a method of bonding a light-emitting element according to a first embodiment of the present invention. FIG. 2 shows the bonding apparatus 10 in side elevation.

As shown in FIGS. 1 and 2, the bonding apparatus 10 has a probe 16 as a light-emitting means for enabling an LED chip 14 as a light-emitting element to emit light before the LED chip 14 is bonded on a board 12, an imaging means 18 for recognizing the center of a light-emitting area of the LED chip 14 and recognizing contour reference coordinates of the LED chip 14 with respect to the coordinates of the recognized center of the light-emitting area of the LED chip 14, and a light-emitting-element holding means 20 for positioning the LED chip 14 in a bonding position on the board 12.

The bonding apparatus 10 has a mount base 22 with a displacement mechanism 26 mounted on an upper surface 24 thereof. The displacement mechanism 26 has a first movable stage 30 movable along a Y-axis of an orthogonal coordinate system by a first motor 28 and a second movable stage 34 movable along an X-axis of the orthogonal coordinate system with respect to the first movable stage 30 by a second motor 32.

The first movable stage 30 comprises a pair of guide rails 36a, 36b extending along the Y-axis and a ball screw 38 disposed between guide rails 36a, 36b and extending along the Y-axis. The first motor 28 has an output shaft coupled to an end of the ball screw 38. The ball screw 38 is threaded through a nut (not shown) fixed to a lower surface of a Y-axis movable table 40 that is movably supported on the guide rails 36a, 36b.

The Y-axis movable table 40 is of an elongate shape along the X-axis. The Y-axis movable table 40 supports thereon a pair of guide rails 42a, 42b extending along the X-axis and a ball screw 44 disposed between guide rails 42a, 42b and extending along the X-axis. The guide rails 42a, 42b and the ball screw 44 belong to the second movable stage 34. The second motor 32 has an output shaft coupled to an end of the ball screw 44. The ball screw 44 is threaded through a nut (not shown) fixed to a lower surface of an X-axis movable table 46 that is movably supported on the guide rails 42a, 42b.

The X-axis movable table 46 supports on an upper surface 48 thereof a chip carrier base 52 for carrying a plurality of LED chips 14, a θ stage 54 for correcting the angular position of each of the LED chips 14, and a board suction base (board holding means) 56 for attracting and holding a board 12. The θ stage 54 has a turntable 58 which is rotatable about a vertical Z-axis by an actuator (not shown).

A column 60 is vertically mounted on an end of the mount base 22. The column 60 supports thereon an actuating means 62 for moving the probe 16 and the light-emitting-element holding means 20 back and forth along the Z-axis and the X-axis. The actuating means 62 has a frame 64 fixed to a vertical surface of the column 60, and a third motor 66 is fixed to an end of the frame 64 and has an output shaft coupled to a ball screw 68 extending along the X-axis and threaded through an X-axis table 70. A vertical frame 72 is fixed to the X-axis table 70.

A fourth motor 74 is fixed to an upper end of the frame 72 and has an output shaft coupled to a ball screw 76 extending along the Z-axis and threaded through a vertically movable base 78. The vertically movable base 78 supports thereon a collet 80 of the light-emitting-element holding means 20 which is connected to a vacuum source (not shown). The probe 16 is fixed to the vertically movable base 78, and a feeler 82 inclined with respect to the Z-axis is mounted on a lower distal end of the probe 16.

The imaging means 18 has an arm 84 mounted on the column 60 supporting CCD cameras 86, 88 on its distal end, the CCD cameras 86, 88 being directed along the Z- and X-axes, respectively. A two-focus optical system 90 is positioned on the optical axes of the CCD cameras 86, 88. An image processor 100 for being supplied with images captured by the CCD cameras 86, 88 and processing the supplied images to recognize the coordinates of a contour reference point L1 (described later on) is disposed on one side of the mount base 22.

Figure 3:
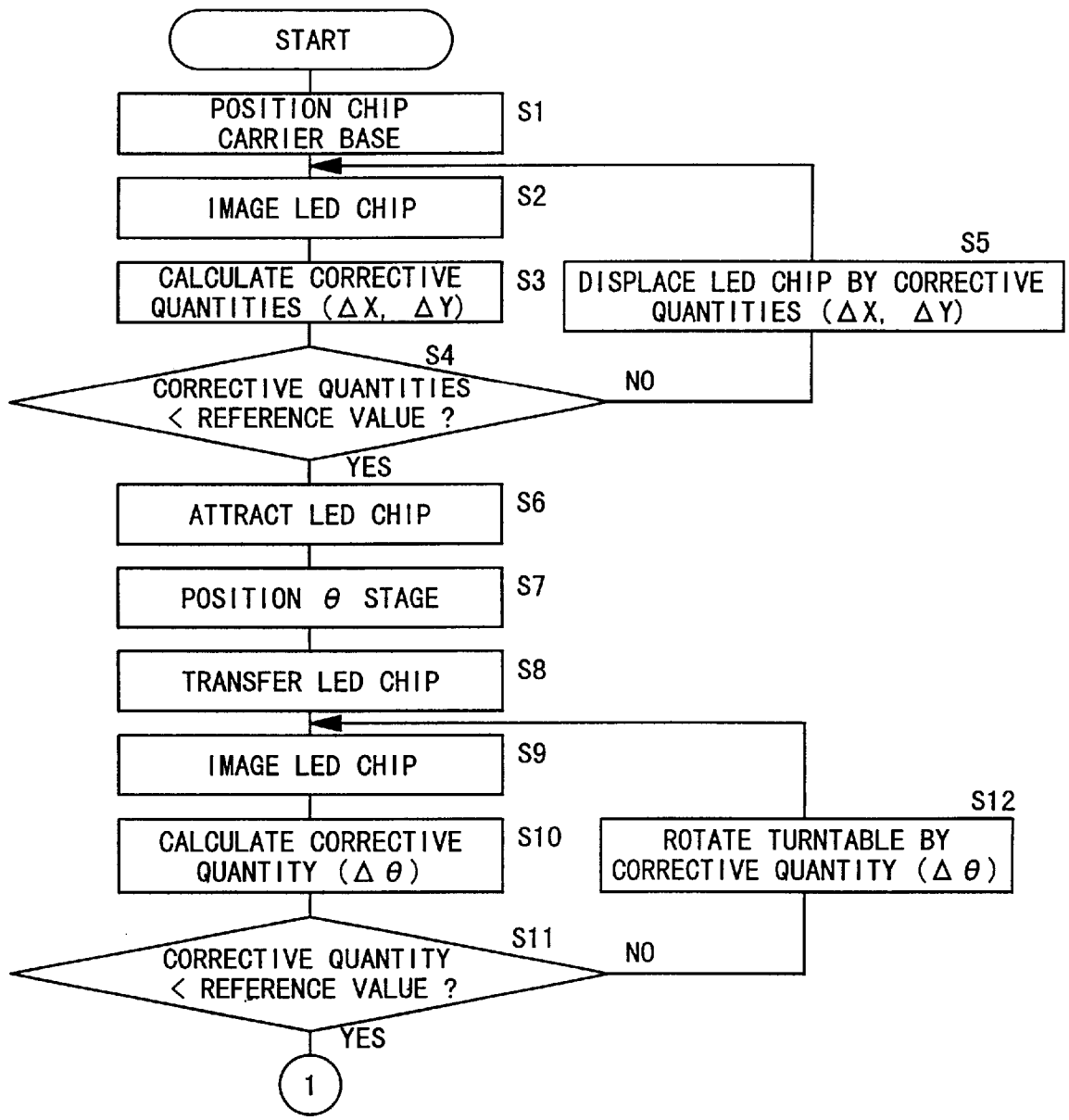
FIG. 3 is a flowchart of a former part of the bonding method according to the first embodiment.
Figure 4:
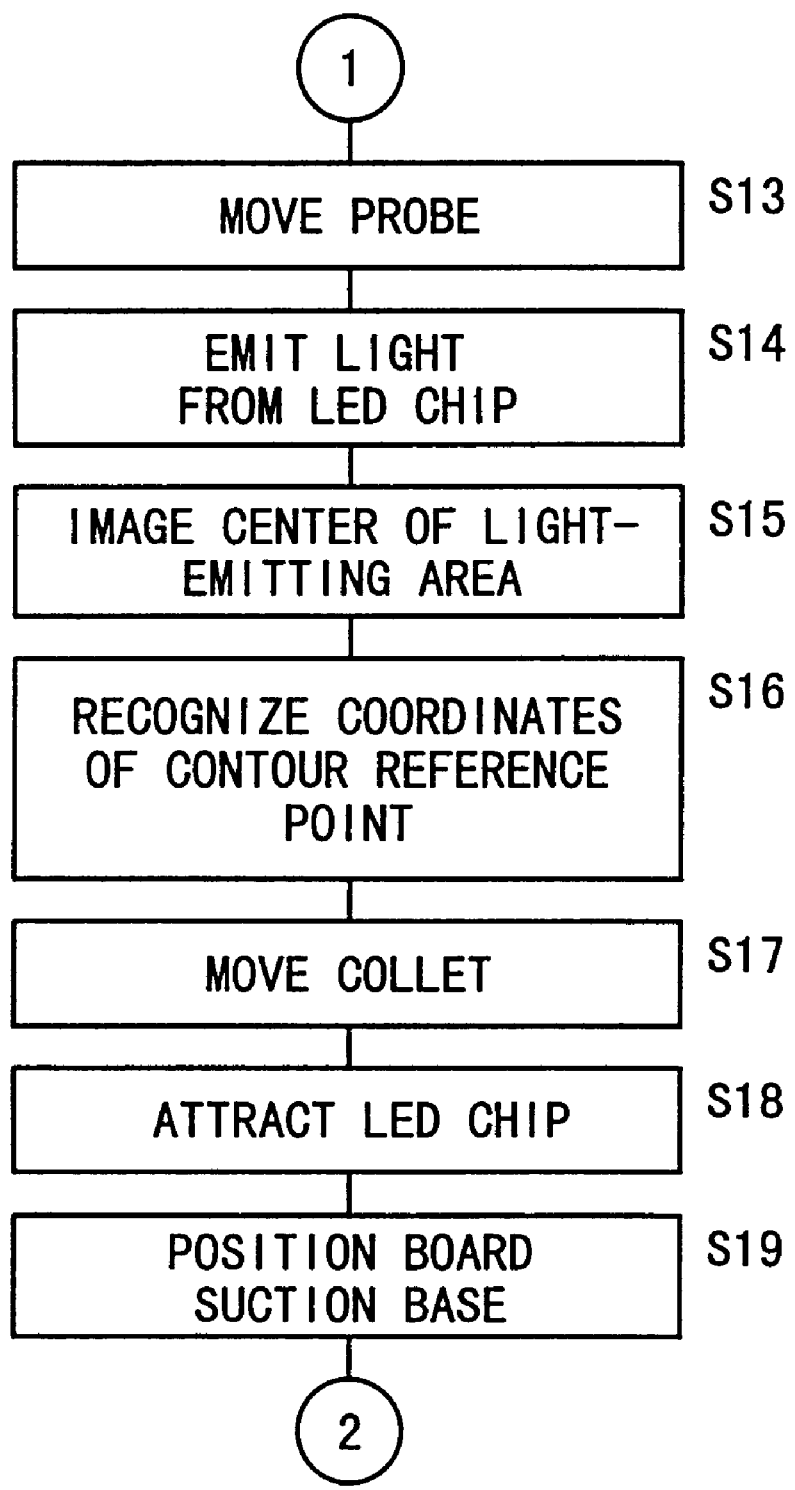
FIG. 4 is a flowchart of a middle part of the bonding method according to the first embodiment.
Figure 5:
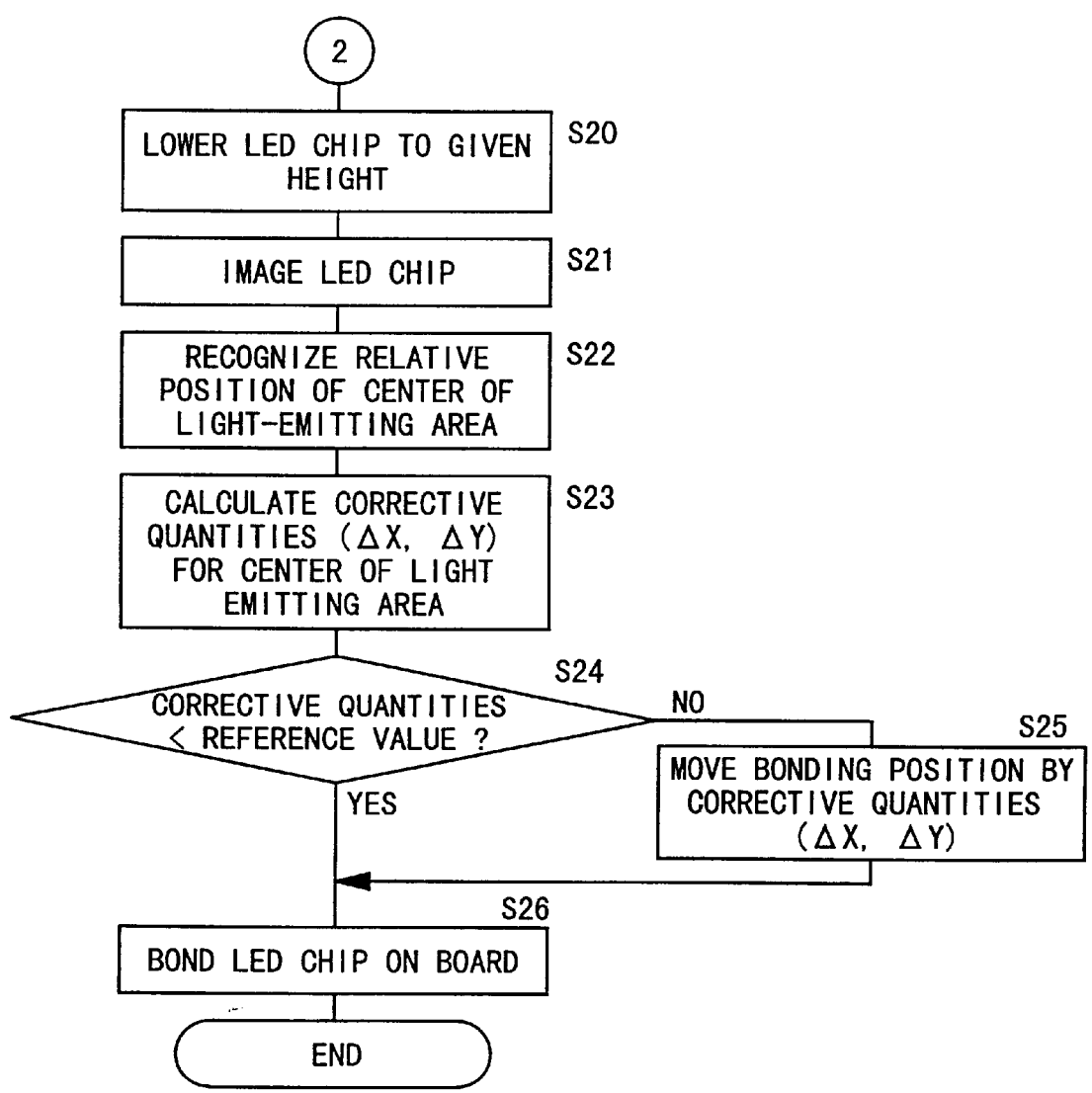
FIG. 5 is a flowchart of a latter part of the bonding method according to the first embodiment.

Operation of the bonding apparatus 10 will be described below with reference to flowcharts shown in FIGS. 3 through 5.

The board 12 is set on the board suction base 56. The board 12 has been positioned with its edge along the X-axis being held in alignment with a station reference surface (not shown), and attracted to the board suction base 56 under a vacuum developed via suction holes (not shown) in the board suction base 56. A plurality of LED chips 14 in the form of a chip wafer 50 are placed on the chip carrier base 52.

The displacement mechanism 26 is actuated to position the chip carrier base 52 into alignment with a camera center of the imaging means 18, i.e., a chip removal position in step S1. In the displacement mechanism 26, the first motor 28 is energized to rotate the ball screw 38 about its own axis to move the Y-axis movable table 40 along the Y-axis, and the second motor 32 is energized to rotate the ball screw 44 about its own axis to move the X-axis movable table 46 along the X-axis. Therefore, when the first and second motors 28, 32 are energized, the LED chips 14 on the chip carrier base 52 are brought into the component removal position.

A certain LED chip 14 of the chip wafer 50 on the chip carrier base 52 is now imaged by the CCD camera 86, for example, of the imaging means 18 in step S2. An image signal representing the LED chip 14 which has been imaged by the CCD camera 86 is sent to the image processor 100, which processes the image signal to recognize a reference area of the LED chip 14, e.g., an upper electrode center or a contour center, and calculate corrective quantities ΔX, ΔY for the LED chip 16 in step S3.

The corrective quantities ΔX, ΔY calculated from the image signal are then compared with a preset reference value in step S4. If the corrective quantities ΔX, ΔY are greater than the preset reference value, then the LED chip 14 is moved by the corrective quantities ΔX, ΔY in step S5.

Specifically, the LED chip 14 is moved by the corrective quantity ΔX by the first motor 28 and by the corrective quantity ΔY by the second motor 32.

Figure 6:
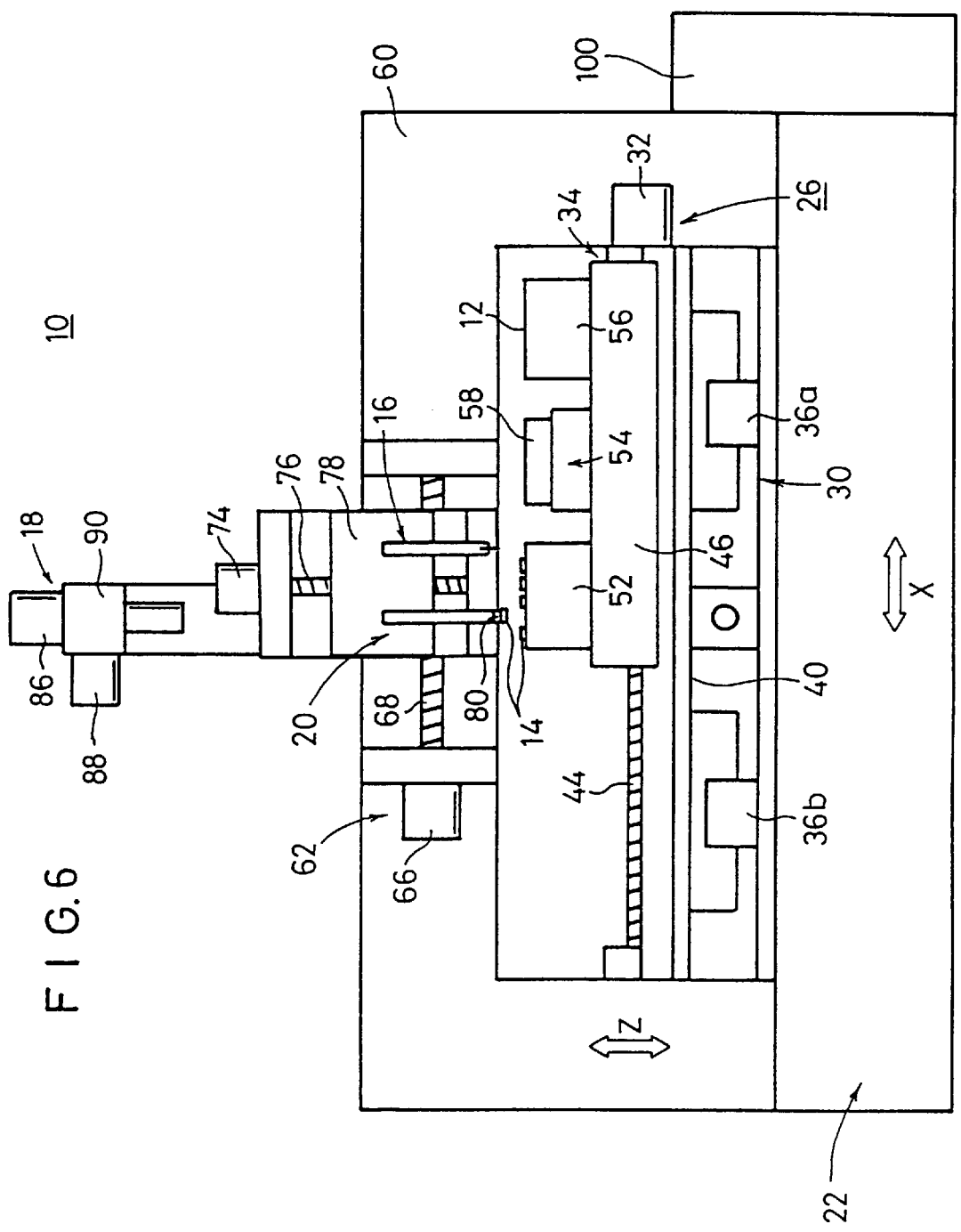
FIG. 6 is a front elevational view of the bonding apparatus shown in FIG. 1 with an LED chip on a chip table.

If the corrective quantities ΔX, ΔY are smaller than the preset reference value in step S4, then the collet 80 attracts and holds the LED chip 14 in step S6. Specifically, the collet 80 is positioned on the camera center of the imaging means 18 by the actuating means 62, and thereafter the fourth motor 74 is energized to lower the vertically movable base 78. The collet 80 on the vertically movable base 78 abuts against the LED chip 14 positioned as described above, and the non-illustrated vacuum source is actuated to cause the collet 80 to attract the LED chip 14. The fourth motor 74 is reversed to lift the vertically movable base 78 to elevate the LED chip 14 in unison with the collet 80 (see FIG. 6).

Figure 7:
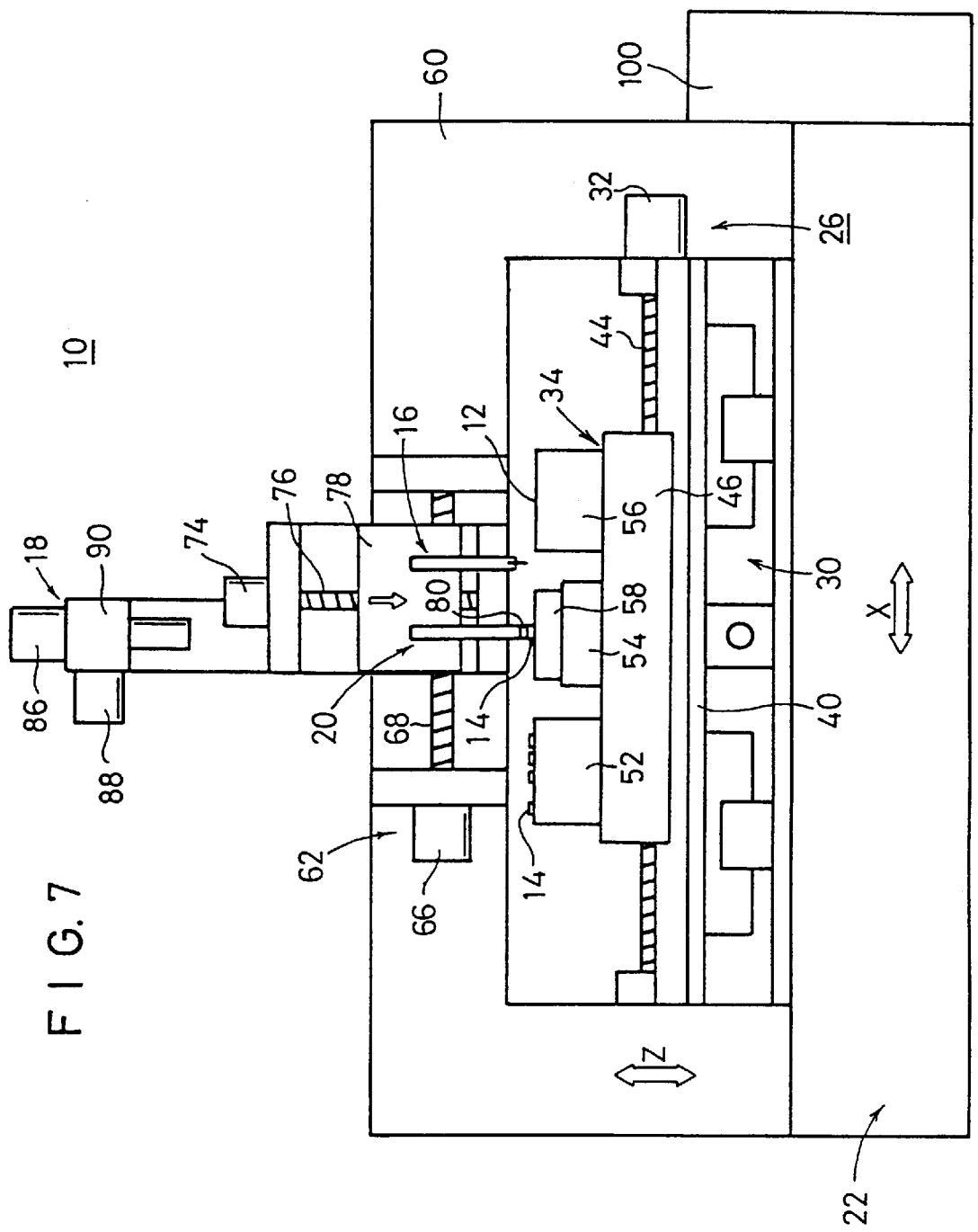
FIG. 7 is a front elevational view of the bonding apparatus shown in FIG. 1 with the LED chip placed on a turntable.

The displacement mechanism 26 is actuated to move the θ stage 54 to the camera center of the imaging means 18 in step S7, after which the collet 80 is lowered in unison with the vertically movable base 78. Therefore, as shown in FIG. 7, the LED chip 14 attracted and held by the collet 80 is transferred onto the turntable 58 of the θ stage 54 in step S8. The collet 80 then releases the LED chip 14, and then moves upwardly with the vertically movable base 78. The CCD camera 86 of the imaging means 18 images the LED chip 14 on the turntable 58 in step S9.

The captured image of the LED chip 14 is processed by the image processor 100, which recognizes the contour edge of the LED chip 14 and calculates a corrective quantity Δθ in step S10. The image processor 100 compares the corrective quantity Δθ with a preset reference value in step S11. If the corrective quantity Δθ is greater than the reference value, then control goes to step S12 in which the turntable 58 is angularly corrected by the corrective quantity Δθ.

Figure 8:
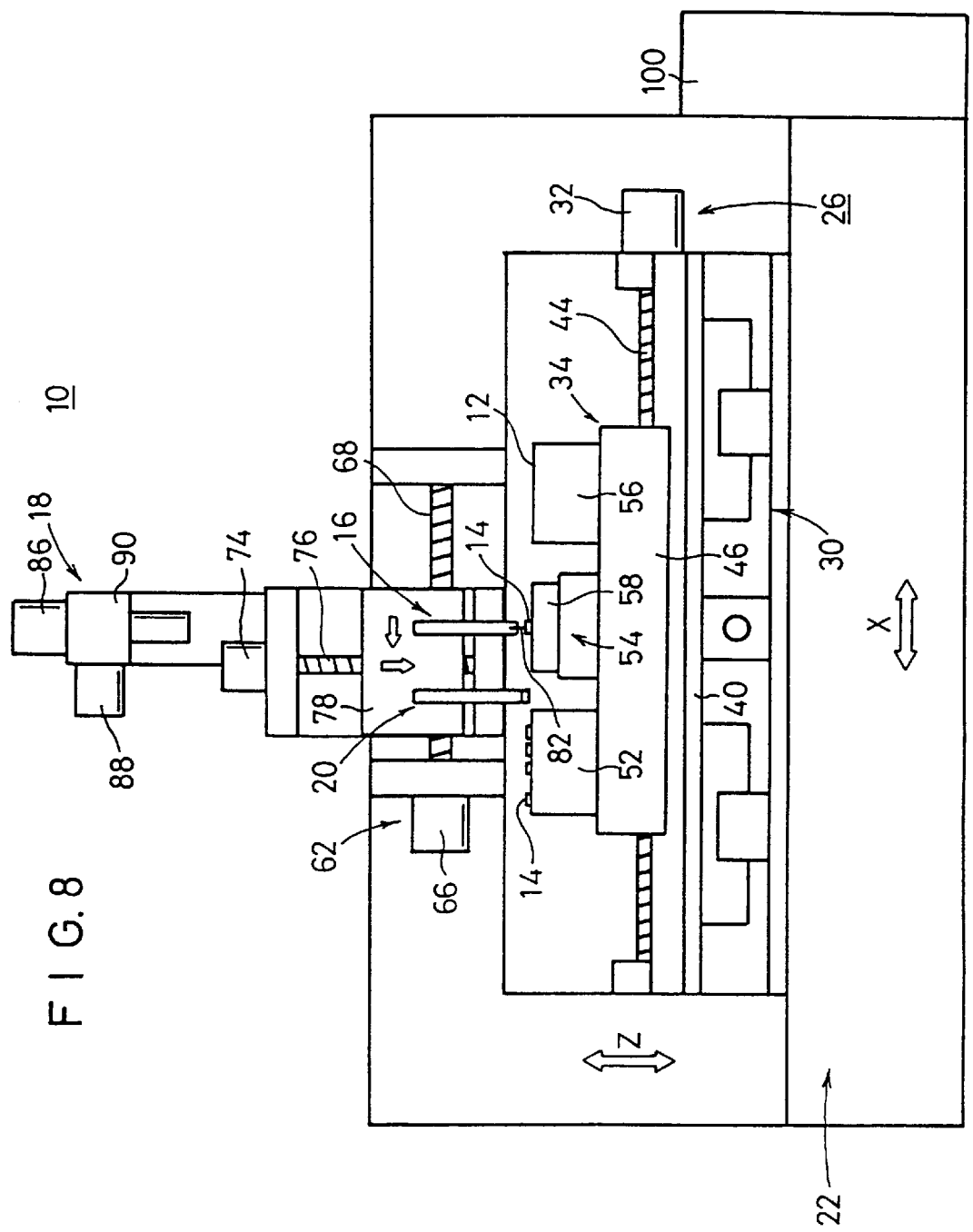
FIG. 8 is a front elevational view of the bonding apparatus shown in FIG. 1 with the LED chip energized for emitting light.

After the angular correction on the θ stage 54 is finished, the third motor 66 of the actuating means 62 is energized to move the frame 72 along the X-axis to position the probe 16 in alignment with the camera center of the imaging means 18 in step S13. The fourth motor 74 is energized to lower the vertically movable base 78 until the feeler 82 on the distal end of the probe 16 contacts the LED chip 14 on the turntable 58 (see FIG. 8).

Figure 9:
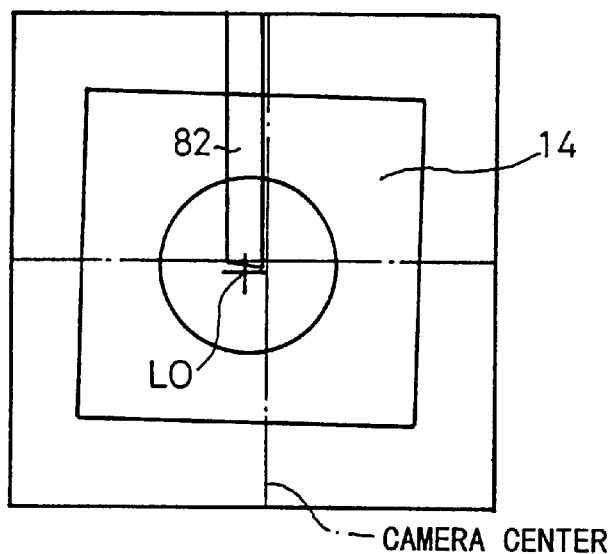
FIG. 9 is a view showing a captured image of the LED chip as it emits light.
Figure 10:
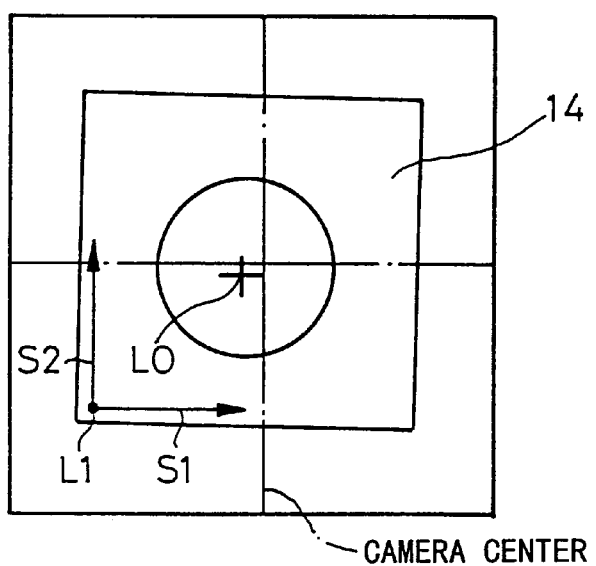
FIG. 10 is a view illustrative of the center of the light-emitting area of the LED chip and contour reference coordinates.

Then, a current power supply (not shown) is turned on to energize the LED chip 14 to emit light in step S14, and the CCD camera 86 of the imaging means 18 images the center L0 of the light-emitting area of the LED chip 14 in step S15 (see FIG. 9). An image signal generated by the CCD camera 86 is sent to the image processor 100, which recognizes the coordinates of the center L0 of the light-emitting area of the LED chip 14. Then, the non-illustrated current power supply is turned off, after which the image processor 100 calculates the coordinates of a contour reference point L1 (the coordinates relative to the center L0 of the light-emitting area) from contour reference lines S1, S2 of the LED chip 14 with respect to the recognized coordinates of the center L0 of the light-emitting area in step S16, as shown in FIG. 10.

The fourth motor 74 of the actuating means 62 is energized to displace the vertically movable base 78 upwardly to disengage the probe 16 from the LED chip 14. Thereafter, the third motor 66 is energized to move the vertically movable base 78 together with the frame 72 along the X-axis for thereby moving the collet 80 into alignment with the camera center of the imaging means 18 in step S17. The fourth motor 74 is energized to lower the vertically movable base 78 for causing the collet 80 into abutment against the LED chip 14 on the turntable 58. The non-illustrated vacuum source is actuated to cause the collet 80 to attract the LED chip 14.

Figure 11:
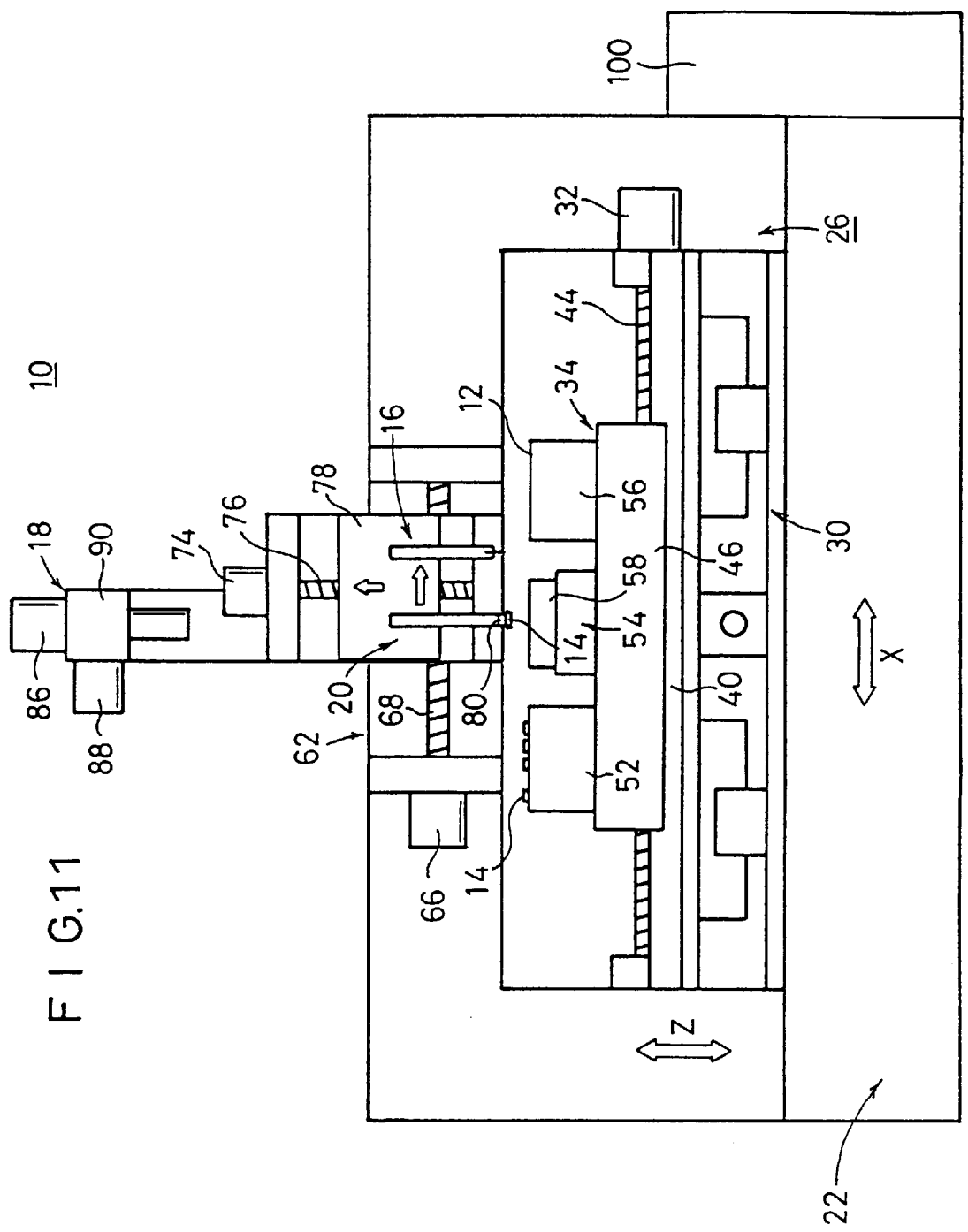
FIG. 11 is a front elevational view of the bonding apparatus shown in FIG. 1 with the LED chip attracted by a collet.

As shown in FIG. 11, the collet 80 is lifted in unison with the vertically movable base 78 by the fourth motor 74 for thereby removing the attracted LED chip 14 from the turntable 58 in step S18. Control proceeds to step S19 in which the bonding position on the board 12 attracted and held by the board suction base 56 is brought into alignment with the camera center of the imaging means 18 by the displacement mechanism 26.

Figure 12:
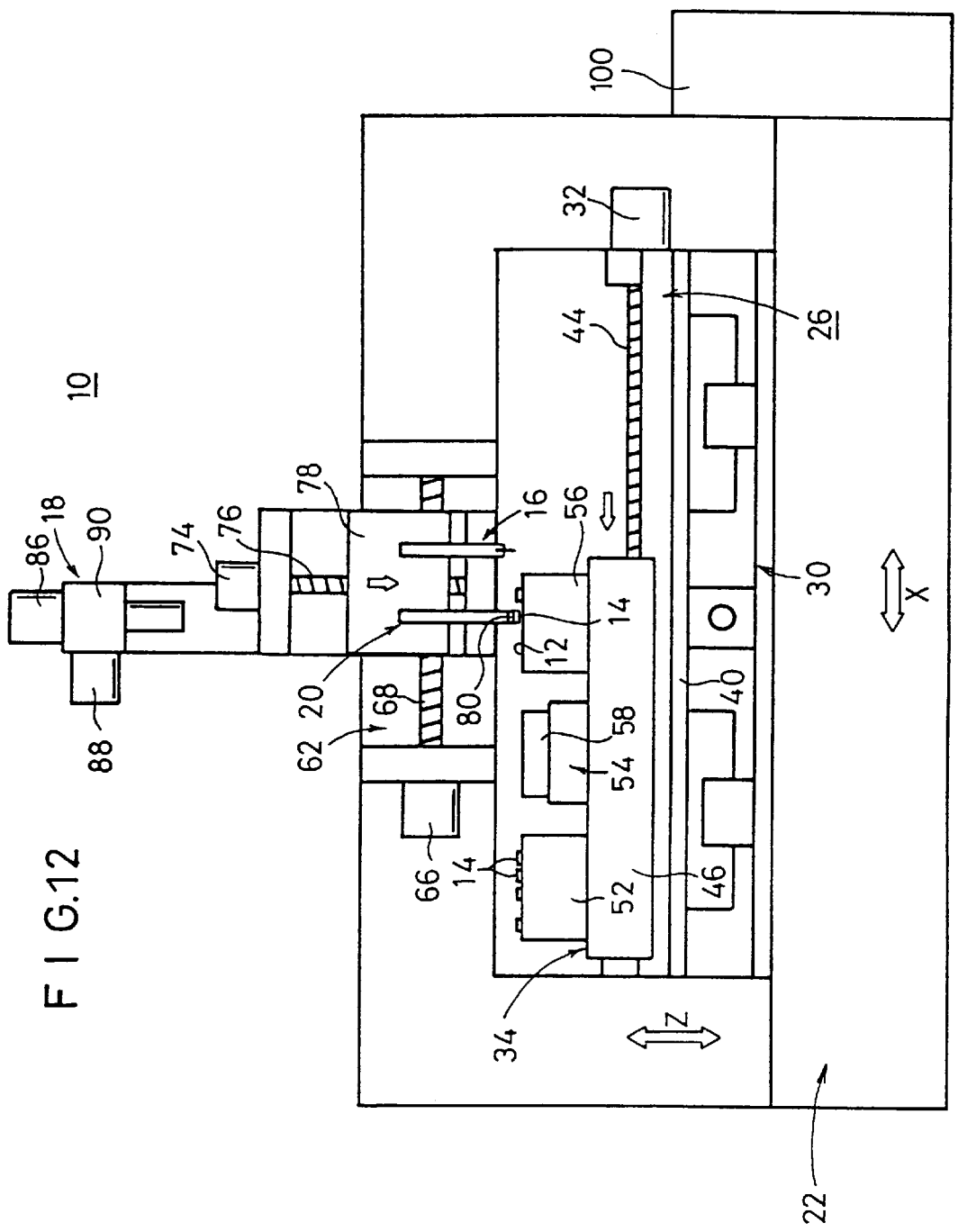
FIG. 12 is a front elevational view of the bonding apparatus shown in FIG. 1 with the LED chip being positioned with respect to a board.
Figure 13:
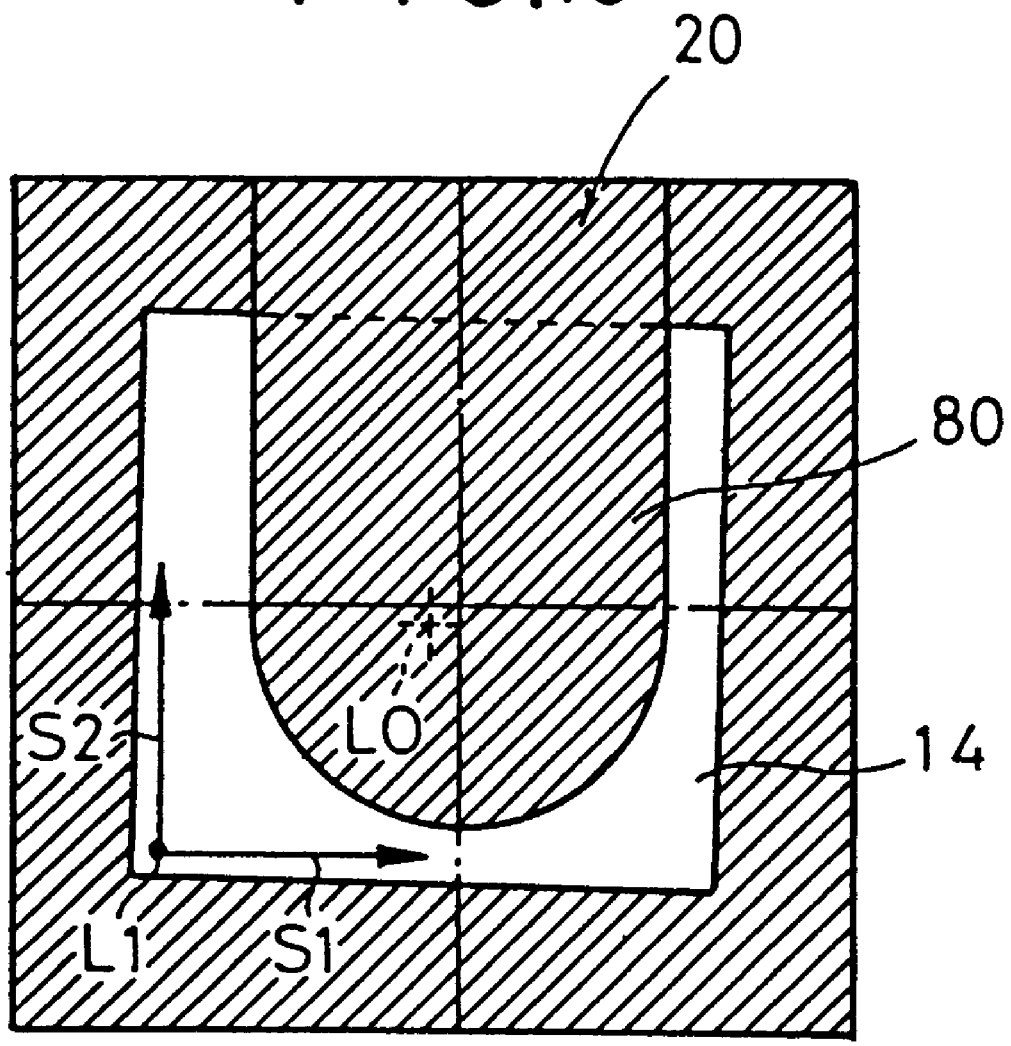
FIG. 13 is a view showing a captured image of the LED chip as it is positioned with respect to the board.

Then, the collet 80 which has attracted the LED chip 14 is lowered by the fourth motor 74. The collet 80 stops its descending movement in a vertical position wherein the distance between the board 12 and the LED chip 14 is about 100 μm in step S20 (see FIG. 12). Then, the CCD camera 88, for example, of the imaging means 18 images the LED chip 14 in step S21.

The image processor 100 recognizes the contour reference lines S1, S2 and the contour reference point L1 of the LED chip 14, and calculates the center L0 of the light-emitting area of the LED chip 14 from the contour reference point L1 and also calculates the corrective quantities ΔX, ΔY which represent a deviation from the bonding position on the board 12 in steps S22, S23. Then, control goes to step S24. If the corrective quantities ΔX, ΔY are greater than a preset reference value in step S24, then the bonding position on the board 12 is corrected in step S25, and thereafter the LED chip 14 is bonded to silver paste on the board 12 in step S26. If the corrective quantities ΔX, ΔY are smaller than the preset reference value in step S24, then control goes directly to step S26 in which the LED chip 14 is bonded to silver paste on the board 12.

Figure 14:
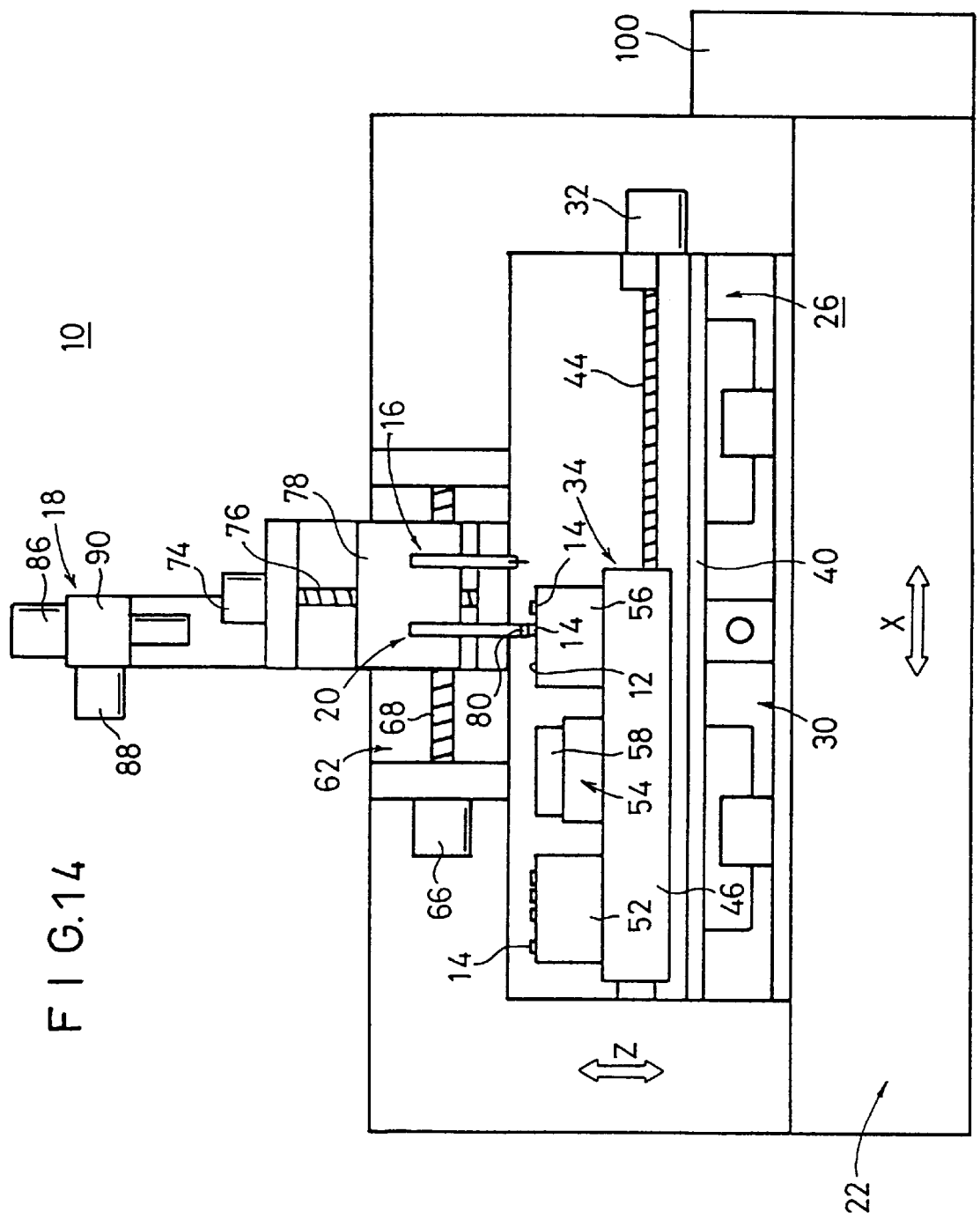
FIG. 14 is a front elevational view of the bonding apparatus shown in FIG. 1 with a second LED being positioned with respect to the board.

The processing in steps S2 through S18 is carried out on a next LED chip 14 placed on the chip carrier base 52. In step S19, the board suction base 56 is moved a constant pitch along the X-axis so that the distance to the previously placed LED chip 14 will be of a predetermined value, after which a new bonding position is set up on the board 12. The processing in step S20 and subsequent steps is carried out to position the next LED chip 14 such that the distance between the centers L0 of the light-emitting areas of the previous and next LED chips 14 on the board 12 will be of a constant pitch, and then bond the next LED chip 14 (see FIG. 14).

Similarly, a desired number of LEDs 14 are successively bonded on the board 12 so that the centers L0 of their light-emitting areas are spaced at the constant pitch. Then, after the LED chips 14 are aligned with each other on the board 12, the silver paste on the board 12 is hardened with heat by an electric oven, for example.

In the first embodiment, as described above, an LED chip 14 to be bonded on the board 12 is caused to emit light by the probe 16 to allow the center L0 of the light-emitting area of the LED chip 14 to be recognized. Then, the coordinates of the contour reference point L1 of the LED chip 14 with respect to the coordinates of the recognized center L0 of the light-emitting area of the LED chip 14 are recognized (calculated), after which the LED chip 14 is positioned in the bonding position on the board 12 based on the coordinates of the contour reference point L1.

Consequently, the center L0 of the light-emitting area of the LED chip 14 can reliably and highly accurately be positioned in place without being adversely affected by variations in the contours and the centers of light-emitting areas of LED chips 14. As a result, it is possible to produce a highly accurate LED array which comprises a plurality of bonded LED chips 14 whose centers of light-emitting area have been spaced at a constant pitch. The LED array thus fabricated is capable of reading and writing images with increased accuracy.

In the first embodiment, LED chips 14 are removed one by one from the chip wafer 50, and successively bonded on the board 12. However, an LED chip 111 shown in FIG. 15 may also be employed in the first embodiment. The LED chip 111 shown in FIG. 15 is of a three-chip structure including a pair of collet-attractable chips 112a, 112b and a light-emitting chip 114 positioned therebetween.

The light-emitting chip 114 emits light, and the collet-attractable chips 112a, 112b do no emit light, but are attracted by the collect 80. When the LED chip 111 is used, the light-emitting chip 114 can emit light while the collet-attractable chips 112a, 112b are being attracted by the collect 80 on the θ stage 54. Therefore, it is possible to prevent the LED chip 111 from being positionally displaced or deviated when the LED chip 111 is attracted by the collet 80.

In the first embodiment, the LED chips 14, 111 are employed as light-emitting elements. However, the present invention is also applicable to the bonding of other minute chip arrays than LED arrays whose centers of light-emitting areas need to be positioned highly accurately. Though the LED chip 111 shown in FIG. 15 is of a three-chip structure, an LED chip to be bonded may be of a two-chip structure or a four- or more-chip structure.

Figure 16:
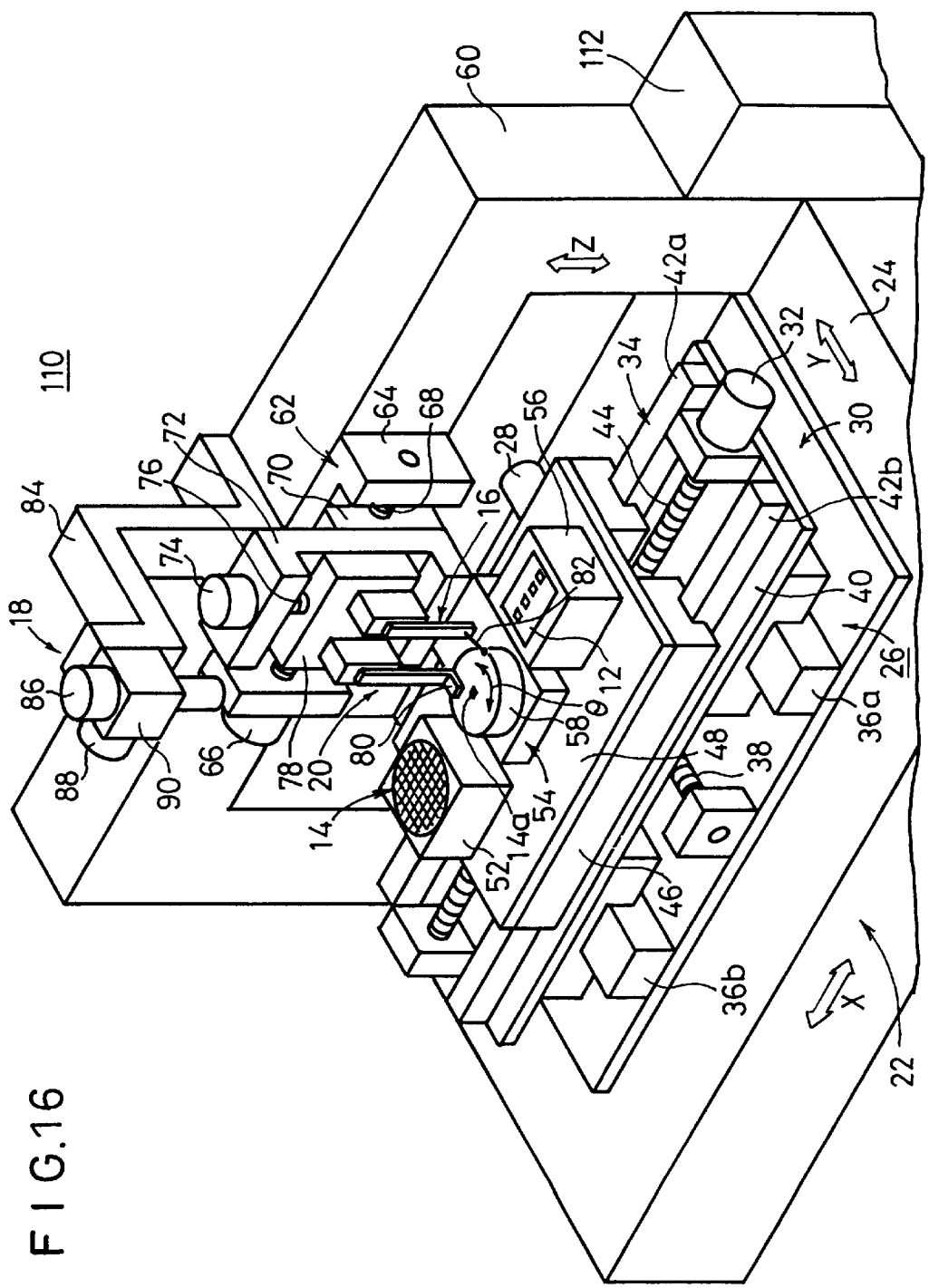
FIG. 16 is a perspective view of a bonding apparatus according to a second embodiment of the present invention.

FIG. 16 shows in perspective a bonding apparatus 110 according to a second embodiment of the present invention.

The bonding apparatus 110 has a probe 16 for enabling an LED chip 14 as a light-emitting element to emit light before the LED chip 14 is bonded on a board 12, an imaging means 18 for recognizing a light-emitting area 14a of the LED chip 14 while the LED chip 14 is emitting light, an image processor 112 for detecting the center of the light-emitting area 14a of the LED chip 14 from a captured image of the light-emitting area 14a, and a light-emitting-element holding means 20 for positioning the LED chip 14 in a bonding position on the board 12. Those parts of the bonding apparatus 110 which are identical to those of the bonding apparatus 10 according to the first embodiment are denoted by identical reference numerals, and will not be described in detail below.

Figure 18:
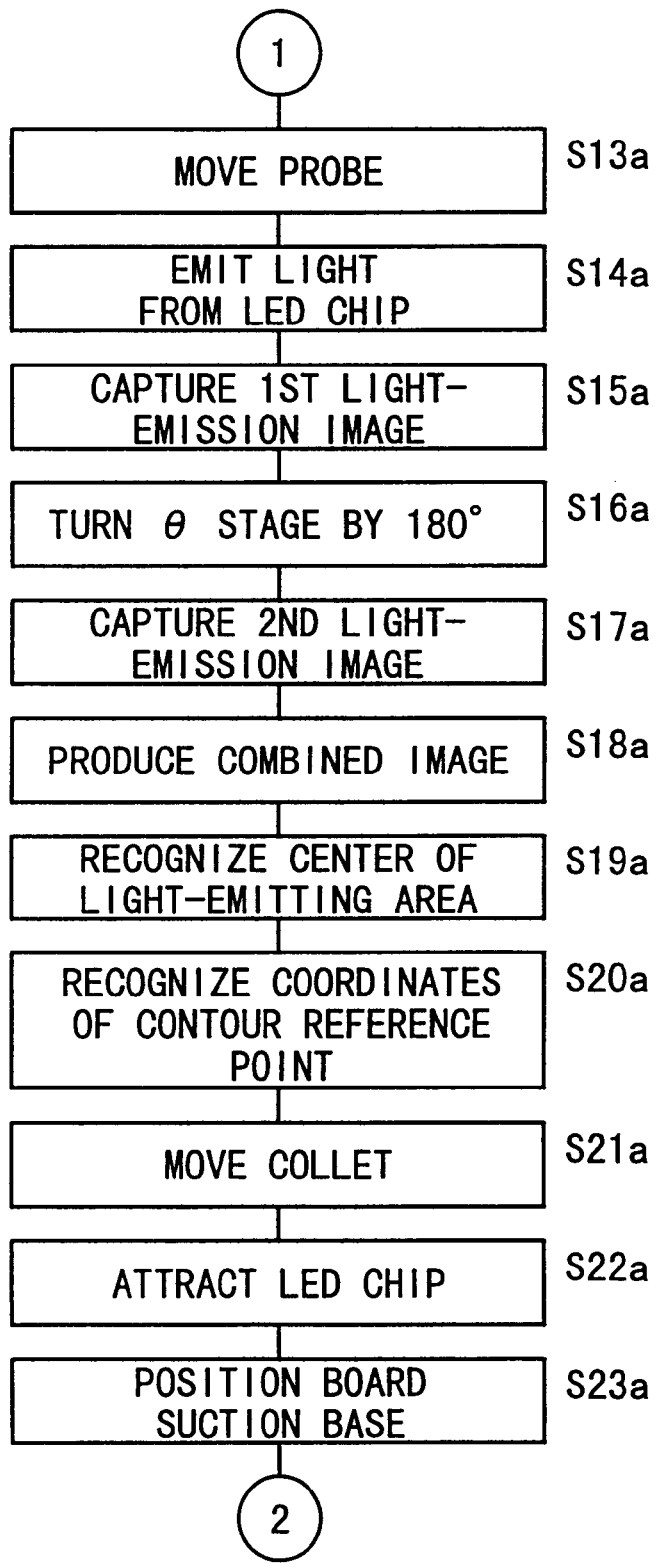
FIG. 18 is a flowchart of a middle part of the operation sequence of the bonding apparatus according to the second embodiment.
Figure 19:
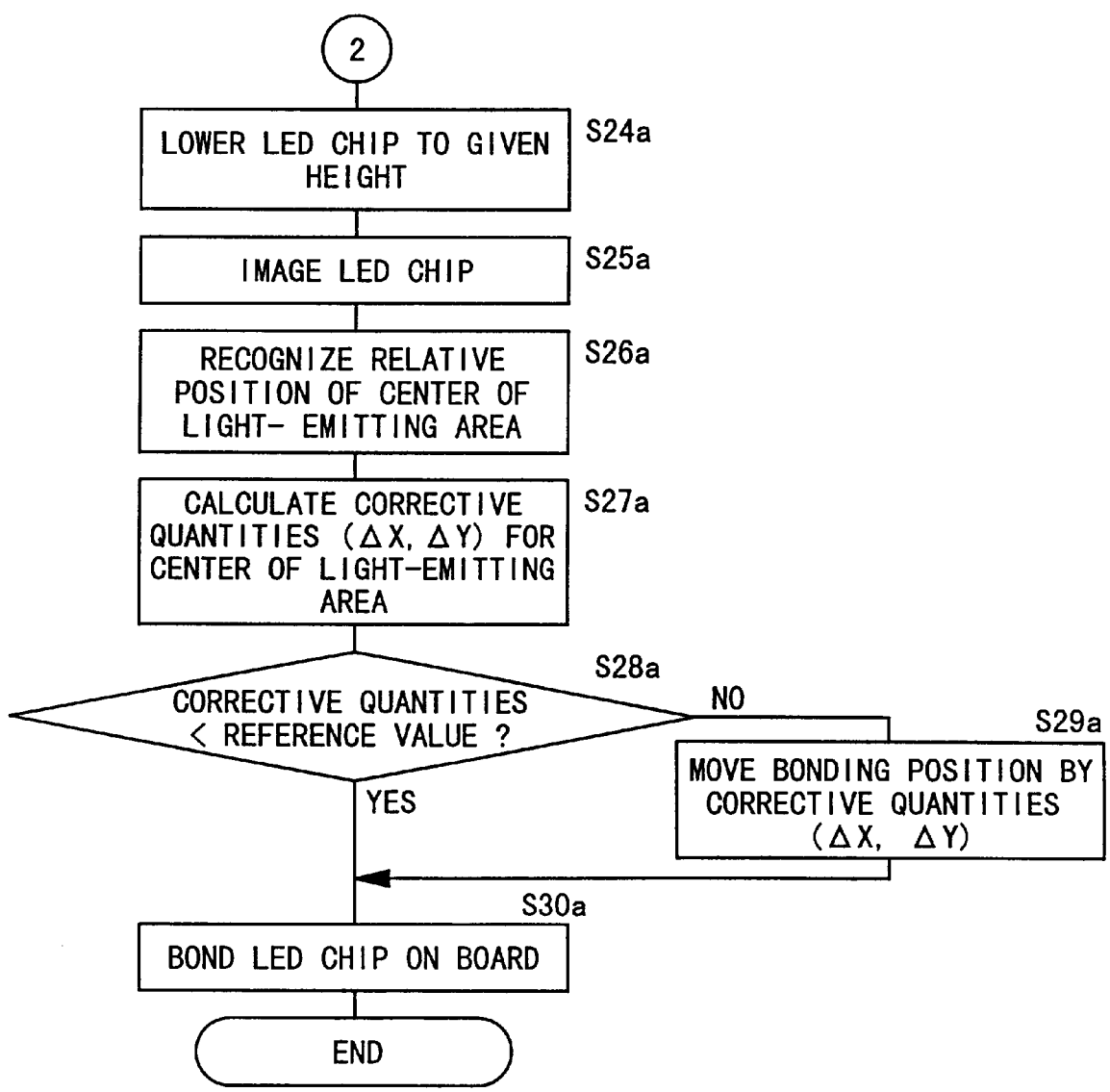
FIG. 19 is a flowchart of a latter part of the operation sequence of the bonding apparatus according to the second embodiment.

Operation of the bonding apparatus 110 will be described below with reference to flowcharts shown in FIGS. 17 through 19.

Figure 17:
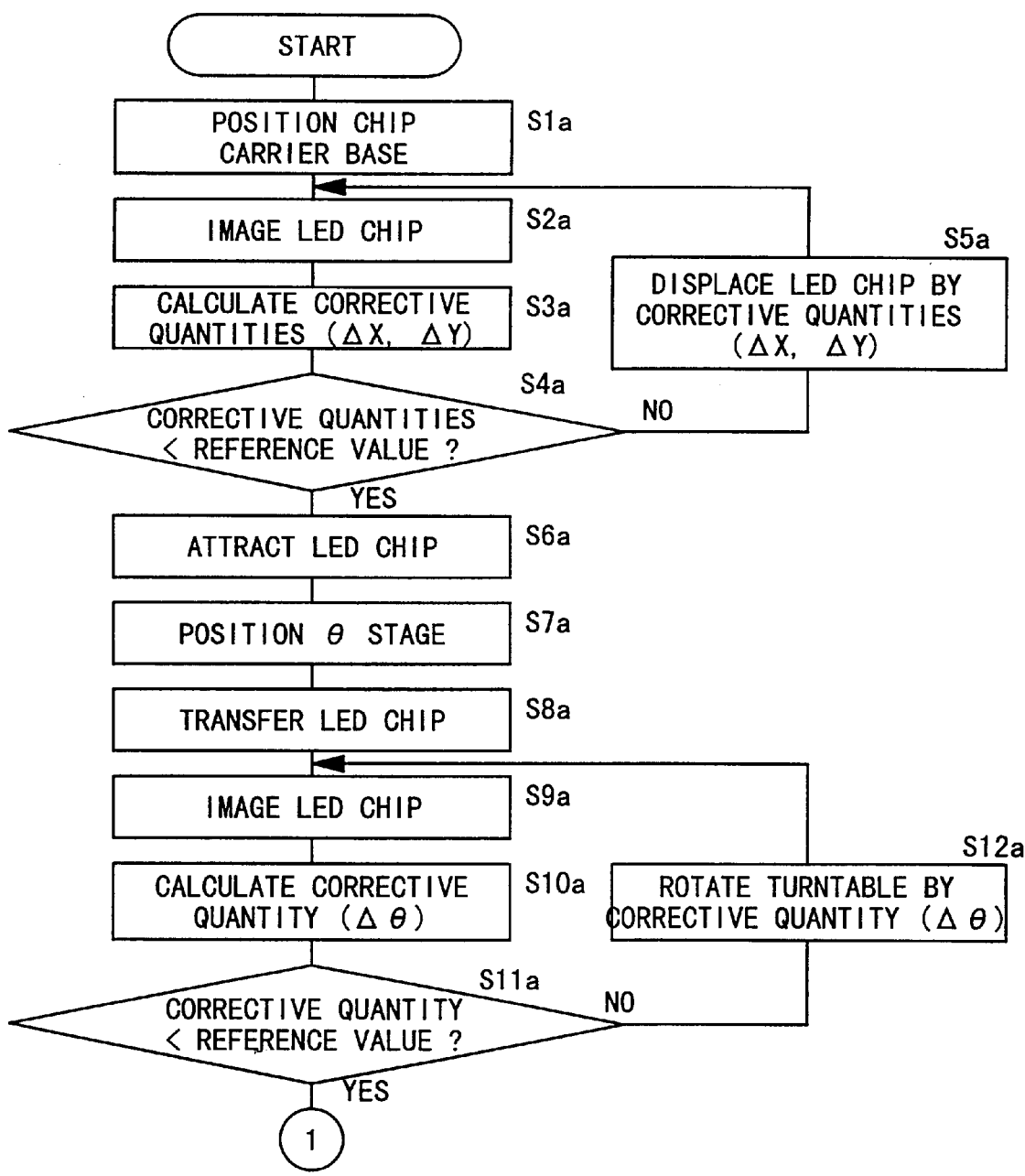
FIG. 17 is a flowchart of a former part of an operation sequence of the bonding apparatus according to the second embodiment.

Steps S1a through S12a shown in FIG. 17 are carried out in the same manner as steps S1 through S12 according to the first embodiment. Thereafter, control goes to step S13a shown in FIG. 18. In step S13a, the third motor 66 of the actuating means 62 is energized to move the frame 72 along the X-axis to position the probe 16 in alignment with the camera center of the imaging means 18. The fourth motor 74 is energized to lower the vertically movable base 78 until the feeler 82 on the distal end of the probe 16 contacts an upper electrode 114 in the light-emitting area 14a of the LED chip 14 on the turntable 58 (see FIG. 20).

Figure 20:
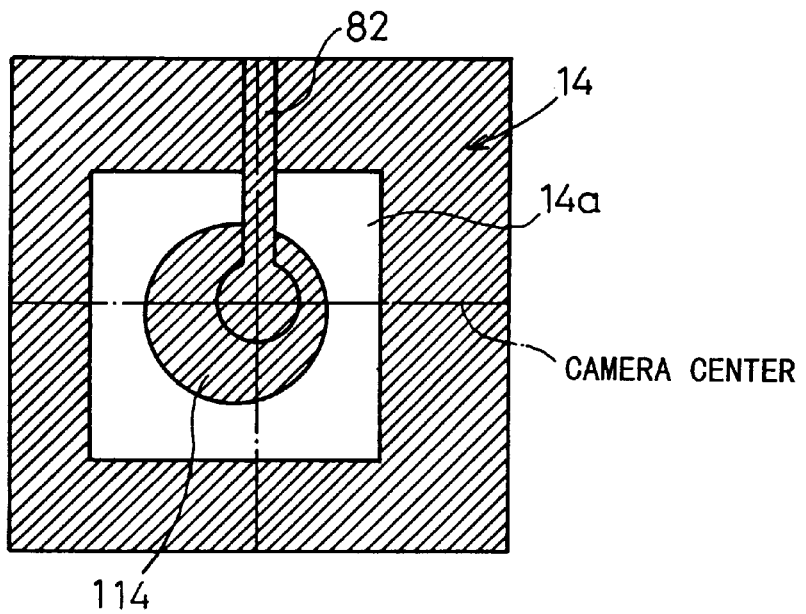
FIG. 20 is a view showing a captured image of an LED chip as it emits light in the bonding apparatus according to the second embodiment.

Then, a current power supply (not shown) is turned on to energize the LED chip 14 to emit light in step S14a, and the CCD camera 86 of the imaging means 18 captures a light-emission image of the LED chip 14 via an ND filter (not shown) in step S15a (see FIG. 20). An image signal generated by the CCD camera 86 is sent to the image processor 112.

The fourth motor 74 is energized to displace the vertically movable base 78 upwardly to disengage the feeler 82 from the LED chip 14. After the turntable 58 is rotated 180° in step S16a, the probe 16 is lowered in unison with the vertically movable base 78, bringing the feeler 82 into contact with the LED chip 14 again to cause the LED chip 14 to emit light. The CCD camera 86 of the imaging means 18 captures another light-emission image of the LED chip 14 via the ND filter (not shown) in step S17a, and an image signal generated by the CCD camera 86 is sent to the image processor 112.

Figure 21:
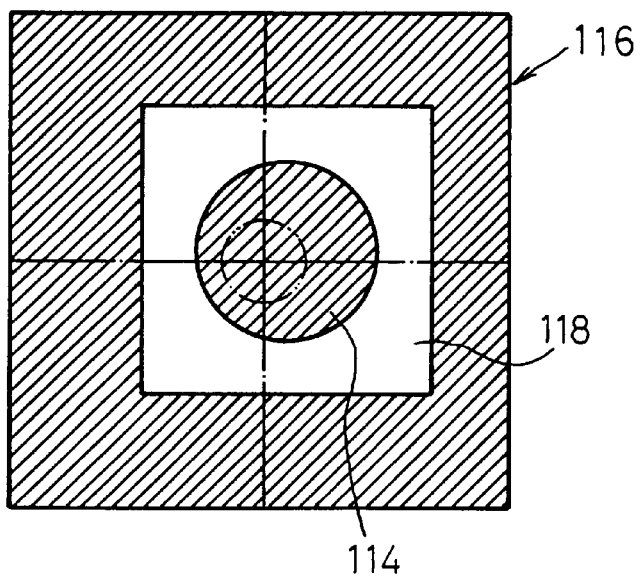
FIG. 21 is a view showing a combined image.

The image processor 112 combines the two captured light-emission images of the LED chip 14 into a combined image 116 in step S18a (see FIG. 21). Specifically, each of the light-emission images captured by the CCD camera 86 contains a shadow of the feeler 82 (see FIG. 20), and the shadow of the feeler 82 can be removed when the two captured light-emission images of the LED chip 14, which are angularly moved 180° with respect to each other, are combined. Therefore, the combined image 116 includes a dark area corresponding to the upper electrode 114 of the LED chip 14 and a bright area representing a light-emitted surface 118 in step S18a.

Figure 22:
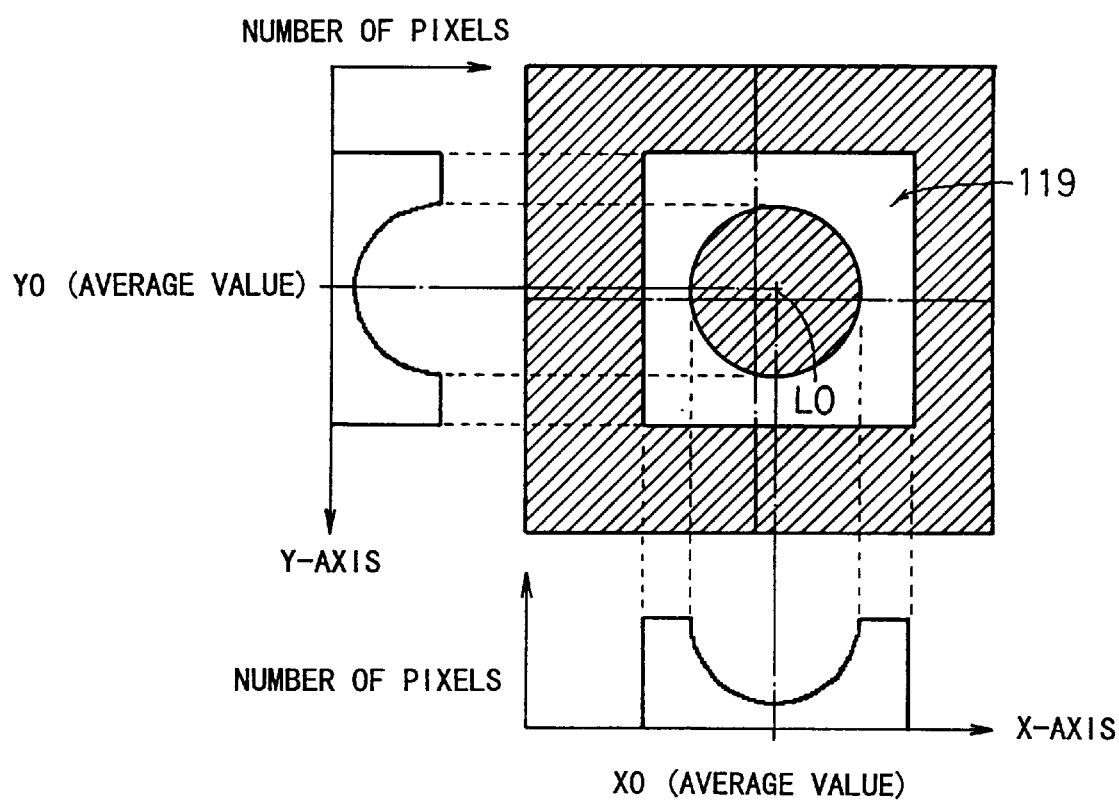
FIG. 22 is a view illustrative of the manner in which the center of gravity of an area is determined from a binary image.

Then, the image processor 112 converts the combined image 116 into a binary image 119 as shown in FIG. 22. For producing the binary image 119, the image processor 112 uses, as a threshold, the brightness value of a certain number of pixels (substantially corresponding to the area of a PN junction of the LED chip 14) as counted from the highest-brightness pixel of the combined image 116. In this manner, a light-emitting area is determined, and the binary image 119 which is highly accurate can reliably be produced without being adversely affected by variations in the intensity of light emitted by various LED chips 14 which would otherwise poses problems if a predetermined brightness level is used as the threshold.

Then, the image processor 112 calculates distributions of the numbers of pixels (total numbers of pixels) along the X- and Y-axes in the binary image 119, and also calculates an average value X0 of the numbers of pixels along the X-axis and an average value Y0 of the numbers of pixels along the Y-axis. The average values X0, Y0 represent the center of gravity of the area (X0, Y0) of the binary image 119. The image processor 112 recognizes the center of gravity of the area as the center L0 of the light-emitting area of the LED chip 14 in step S19a.

Figure 23:
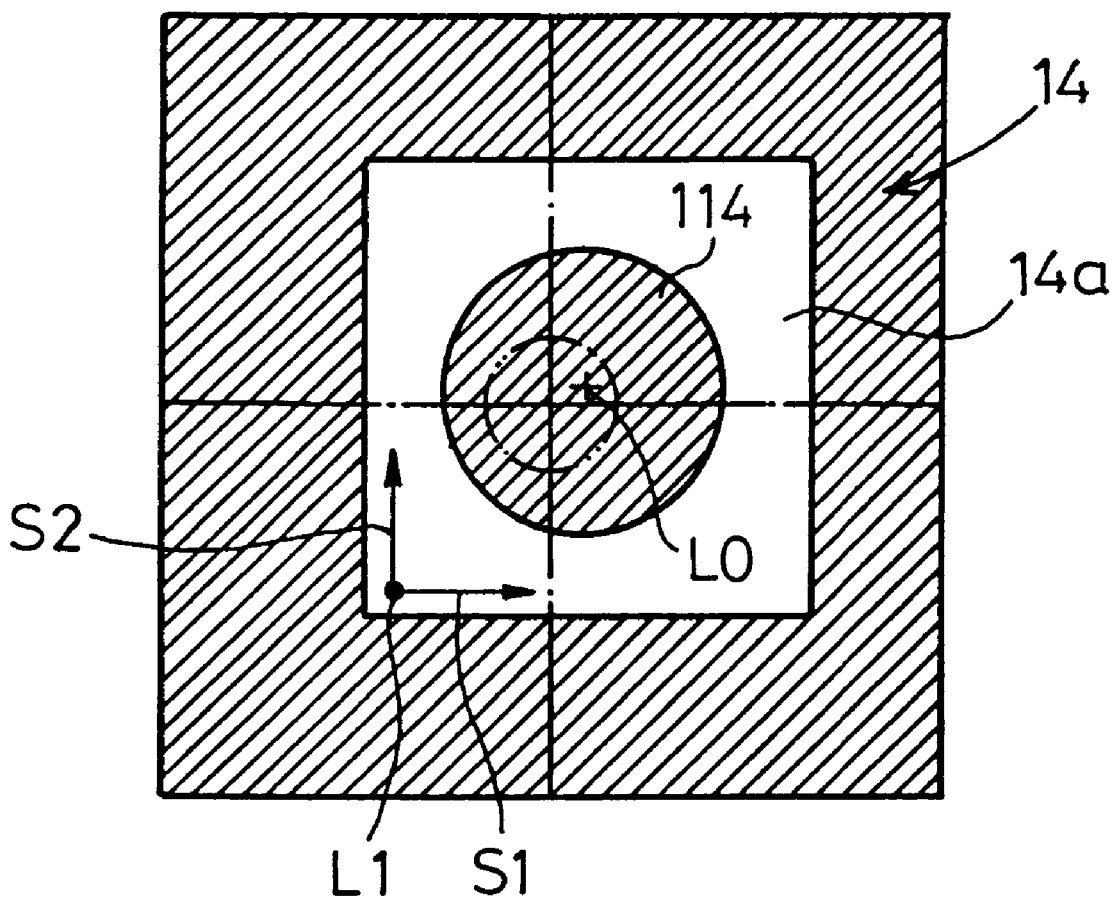
FIG. 23 is a view illustrative of the center of the light-emitting area of the LED chip and contour reference coordinates.

Then, the non-illustrated current power supply is turned off, after which the image processor 112 calculates the coordinates of a contour reference point L1 (the coordinates relative to the center L0 of the light-emitting area) from contour reference lines S1, S2 of the LED chip 14 with respect to the recognized coordinates of the center L0 of the light-emitting area in step S20a, as shown in FIG. 23.

The fourth motor 74 of the actuating means 62 is energized to displace the vertically movable base 78 upwardly to disengage the probe 16 from the LED chip 14. Thereafter, steps S21a through S30a are carried out in the same manner as steps S17 through S26 according to the first embodiment.

In the second embodiment, as described above, the LED chip 14 to be bonded on the board 12 is caused to emit light by the probe 16, and the light-emitting area 14a of the LED chip 14 is imaged by the imaging means 18. At this time, the turntable 58 is turned 180° to capture two images of the LED chip 14, which are then combined into the combined image 116 from which the shadow of the feeler 82 has been removed. Then, the combined image 116 is converted into the binary image 119, and the center of gravity of the area (X0, Y0) of the binary image 119 is calculated as the center L0 of the light-emitting area of the LED chip 14.

Consequently, the center L0 of the light-emitting area of the LED chip 14 can reliably and highly accurately be detected without being adversely affected by variations in the contours and the centers of light-emitting areas of LED chips 14. As a result, it is possible to produce a highly accurate LED array which comprises a plurality of bonded LED chips 14 whose centers of light-emitting area have been spaced at a constant pitch. The LED array thus fabricated is capable of reading and writing images with increased accuracy.

A method of bonding a light-emitting element according to a third embodiment of the present invention will be described below. The method of bonding a light-emitting element according to the third embodiment is carried out according to the flowcharts shown in FIGS. 17 through 19, except that the process of recognizing the center of the light-emitting area of the LED chip 14 is carried out in a manner different from step S19a (FIG. 18). The process of recognizing the center of the light-emitting area of the LED chip 14 according to the third embodiment will be described below.

Figure 24:
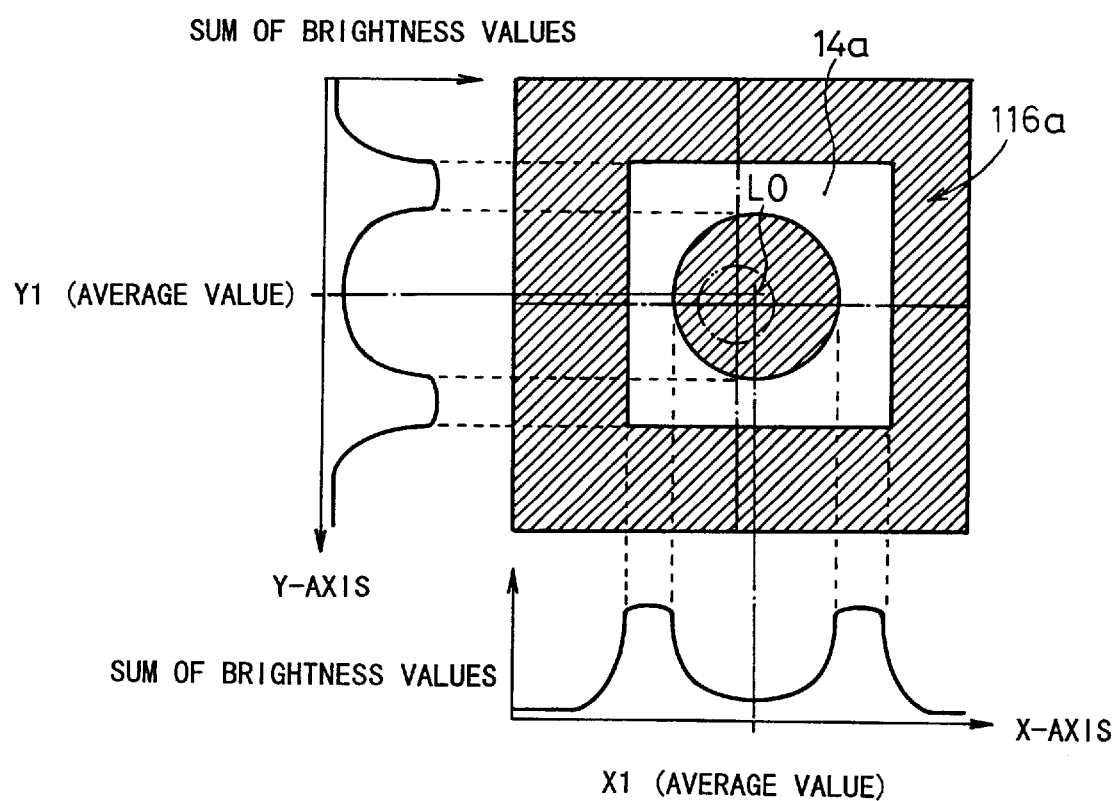
FIG. 24 is a view illustrative of a method of detecting the center of a light-emitting area according to a third embodiment of the present invention.

As shown in FIG. 24, two light-emission images of the LED chip 14 as it emits light are imaged by the CCD camera 86 of the imaging means 18 and combined into a combined image 116a. In the combined image 116a, the pixels of the light-emitting area 14a are weighted depending on their brightness values, and distributions of the sums of brightness values along the X- and Y-axes are calculated. Then, an average value X1 of the brightness values along the X-axis and an average value Y1 of the brightness values along the Y-axis are calculated. The average values X1, Y1 represent the center of gravity of the area (X1, Y1) of the combined image 100a. The center of gravity of the area serves as the center L0 of the light-emitting area of the LED chip 14.

In the third embodiment, therefore, the center L0 of the light-emitting area of the LED chip 14 can reliably and highly accurately be detected without being adversely affected by variations in the contours and the centers of light-emitting areas of LED chips 14, as with the second embodiment.

Figure 25:
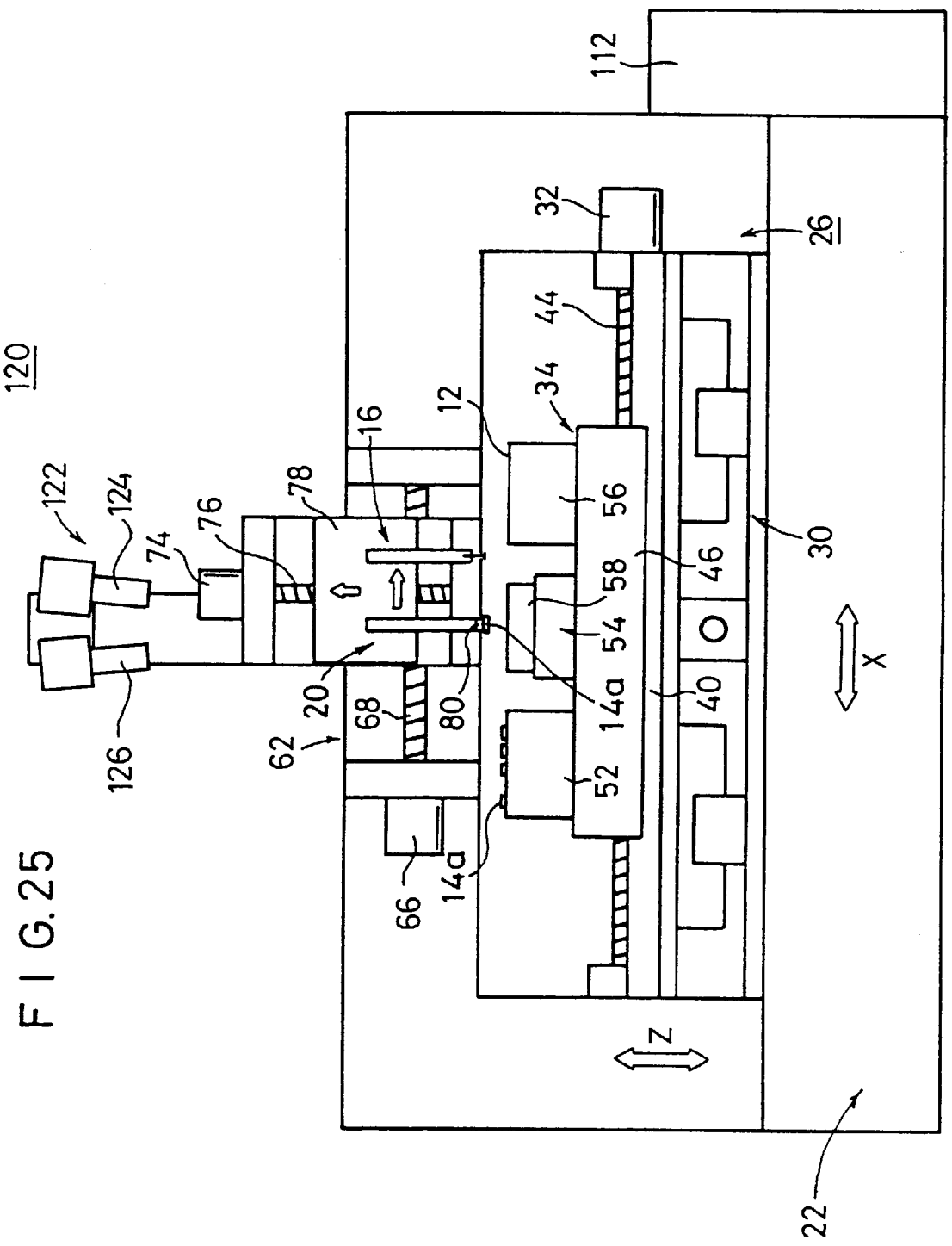
FIG. 25 is a view of a bonding apparatus according to a fourth embodiment of the present invention.

FIG. 25 shows in front elevation a bonding apparatus 120 according to a fourth embodiment of the present invention. Those parts of the bonding apparatus 120 which are identical to those of the bonding apparatus 110 according to the second embodiment are denoted by identical reference numerals, and will not be described in detail below.

The bonding apparatus 120 has an imaging means 122 comprising two CCD cameras 124, 126 which are inclined at respective angles to the vertical direction. The CCD cameras 124, 126 serve to image the LED chip 14 contacted by the probe 16 simultaneously. When the images captured by the CCD cameras 124, 126 are combined, the shadow of the feeler 82 of the probe 16 can be removed from the combined image.

Figure 26:
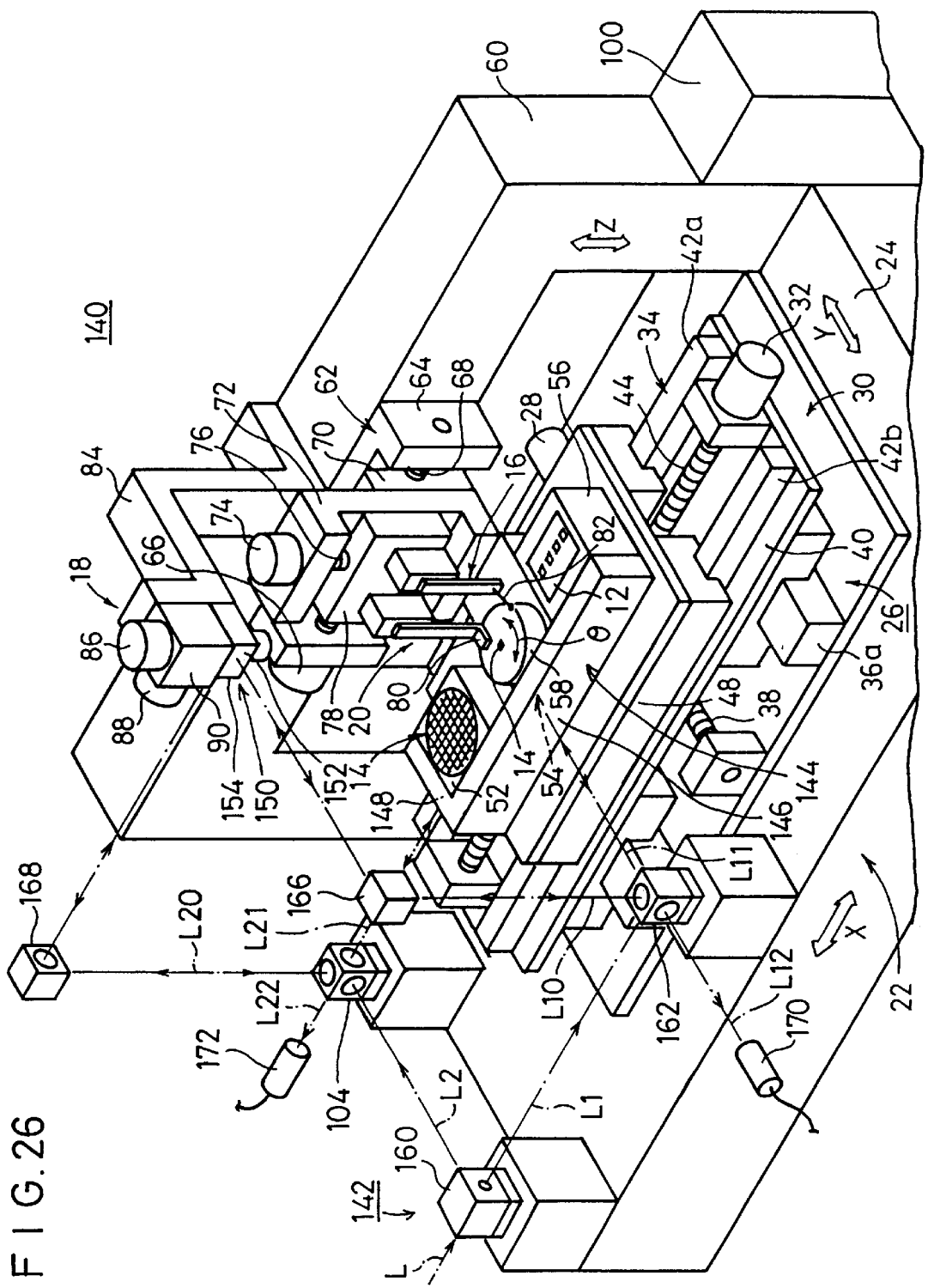
FIG. 26 is a perspective view of a bonding apparatus according to a fifth embodiment of the present invention.
Figure 27:
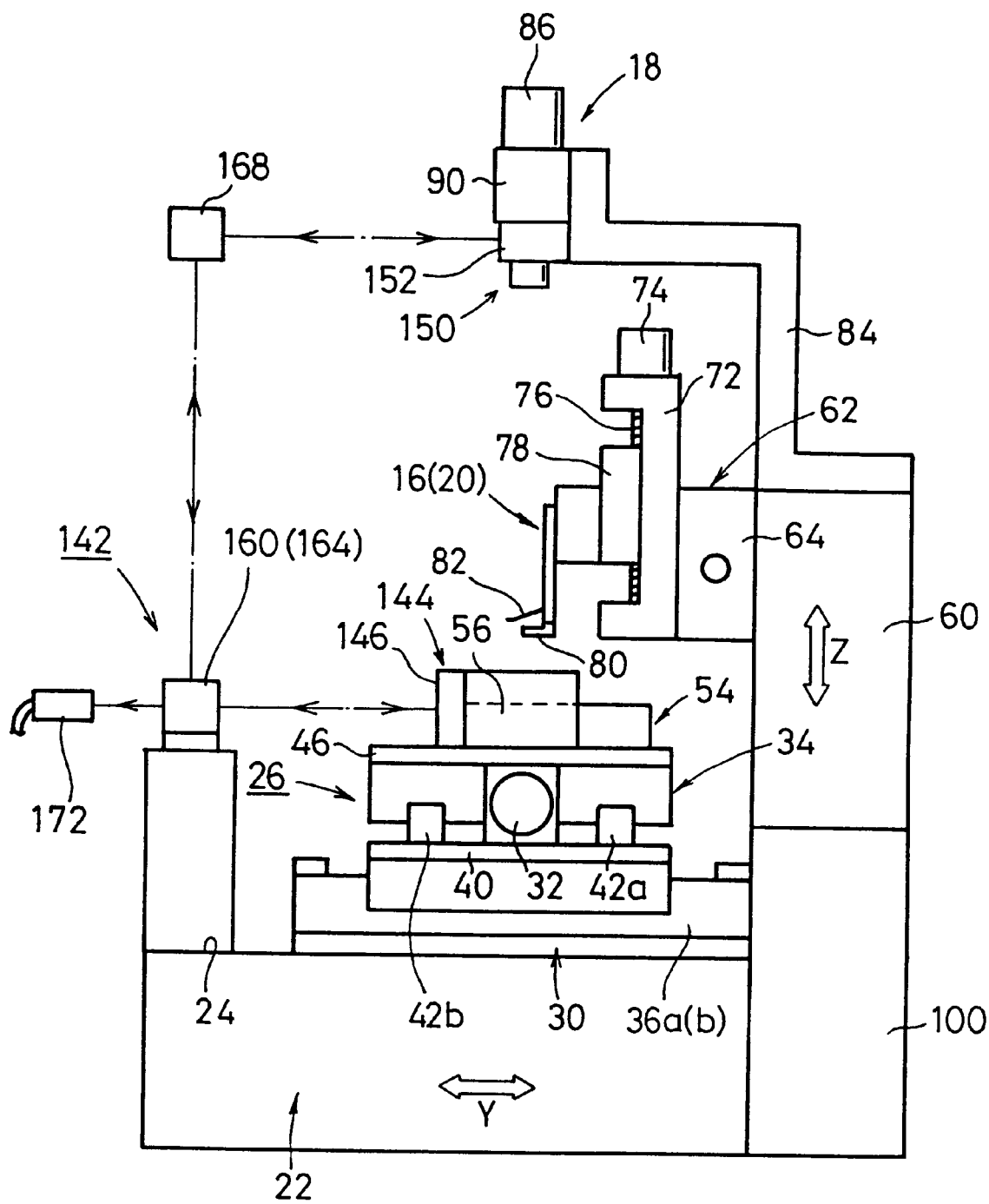
FIG. 27 is a side elevational view of the bonding apparatus shown in FIG. 26.
Figure 28:
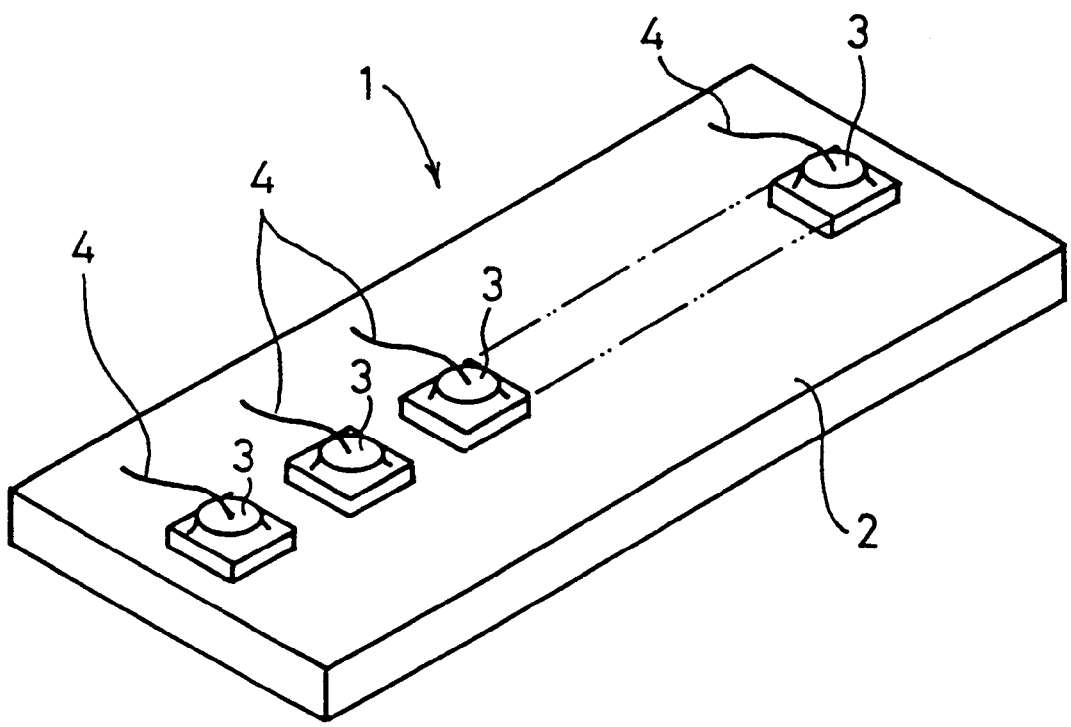
FIG. 28 is a perspective view of a conventional LED array.

FIG. 26 shows in perspective a bonding apparatus 140 according to a fifth embodiment of the present invention, and FIG. 27 shows the bonding apparatus 140 in side elevation. Those parts of the bonding apparatus 140 which are identical to those of the bonding apparatus 10 according to the first embodiment are denoted by identical reference numerals, and will not be described in detail below.

The bonding apparatus 140 has a laser distance measuring mechanism 142 for directly measuring the distance of the board suction base 56 from the bonding position with laser beams. The X-axis movable table 46 supports on the upper surface 48 thereof a mirror block 144 for reflecting a laser beam L emitted from the laser distance measuring mechanism 142. The mirror block 144 is made of a material of small coefficient of thermal expansion, e.g., a glass material.

The mirror block 144 has a first reflecting surface 146 extending along the X-axis and a second reflecting surface 148 extending along the Y-axis. A mirror block 150 is fixed to the two-focus optical system 90. The mirror block 150 has a first reflecting surface 152 extending along the X-axis and a second reflecting surface 154 extending along the Y-axis.

The laser distance measuring mechanism 142 comprises a beam splitter 160 to which a laser beam L generated by a laser beam source (not shown) is applied, a first displaced position detecting means (e.g., a laser interferometer) 162 for dividing a laser beam L1 emitted from the beam splitter 160 along the X-axis into a reference beam L10 and a distance measurement beam L11, applying the reference beam L10, which is directed upwardly, via a mirror 166 to the first reflecting surface 152, which provides a reference position on the Y-axis, of the mirror block 150 associated with the CCD cameras 86, 88, and applying the distance measurement beam L11, which is directed horizontally, to the first reflecting surface 146 of the mirror block 144 thereby to detect a position of the board suction base 56 displaced along the Y-axis with respect to the CCD cameras 86, 88, and a second displaced position detecting means (e.g., a laser interferometer) 164 for dividing a laser beam L2 emitted from the beam splitter 160 along the Y-axis into a reference beam L20 and a distance measurement beam L21, applying the reference beam L20, which is directed upwardly, via a mirror 168 to the second reflecting surface 154, which provides a reference position on the X-axis, of the mirror block 150 associated with the CCD cameras 86, 88, and applying the distance measurement beam L21, which is directed horizontally, to the second reflecting surface 148 of the mirror block 144 thereby to detect a position of the board suction base 56 displaced along the X-axis with respect to the CCD cameras 86, 88.

The first displaced position detecting means 162 causes the distance measurement beam L11 reflected by the first reflecting surface 146 of the mirror block 144 to interfere with the reference beam L10 reflected by the first reflecting surface 152 of the mirror block 150, producing an interference beam L12 which is applied to a first receiver 170. The second displaced position detecting means 164 causes the distance measurement beam L21 reflected by the second reflecting surface 154 of the mirror block 150 to interfere with the reference beam L20 reflected by the second reflecting surface 154 of the mirror block 150, producing an interference beam L22 which is applied to a second receiver 172.

In the bonding apparatus 140, the laser distance measuring mechanism 142 detects whether the bonding position on the board 12 is accurately established with respect to the imaging means 18 or not. In the laser distance measuring mechanism 142, specifically, the laser beam L emitted from the laser beam source is divided by the beam splitter 160 into the laser beam L1 along the X-axis and the laser beam L2 along the Y-axis, and these laser beams L1, L2 are applied to the respective first and second displaced position detecting means 162, 164. The first and second displaced position detecting means 162, 164 apply the upwardly directed reference beams L10, L20 via the respective mirrors 166, 168 to the first and second reflecting surfaces 152, 154 of the imaging means 18, which reflect the reference beams L10, L20 back to the respective first and second displaced position detecting means 162, 164. Furthermore, the horizontally directed distance measurement beams L11, L21 are applied respectively to the first and second reflecting surfaces 146, 148 of the mirror block 144, which reflect the distance measurement beams L11, L21 back to the respective first and second displaced position detecting means 162, 164.

The reference beams L10, L20 and the distance measurement beams L11, L21 interfere with each other, producing the interference beams L12, L22 that are emitted from the first and second displaced position detecting means 162, 164 to the first and second receivers 170, 172, respectively. Consequently, the bonding position on the board 12 held in position near the mirror block 144 is biaxially detected.

In the fifth embodiment, as described above, the laser beams L1, L2 emitted from the beam splitter 160 are divided by the first and second displaced position detecting means 162, 164 into the reference beams L10, L20 and the distance measurement beams L11, L21 that are reflected by the mirror blocks 150, 144. In this manner, relative positions with respect to the reference positions on the X- and Y-axes provided by the fixed CCD cameras 86, 88 are detected for measuring the distance from the bonding position on the board 12 with the laser beams.

Accordingly, the CCD cameras 86, 88 and the bonding position can be positioned accurately relatively to each other, so that the accuracy with which to position the bonding position can effectively be increased. The laser distance measuring mechanism 142 is versatile in applications as the board 12 does not need to be transparent.

In the method of and the apparatus for bonding a light-emitting element according to the present invention, before the light-emitting element is bonded, it is caused to emit light for recognizing the center of the light-emitting area thereof, and then the light-emitting element is bonded while the contour reference point of the light-emitting element corresponding to the center of the light-emitting area is being observed. As a result, the center of the light-emitting area of each of light-emitting elements can reliably and highly accurately be positioned in place on the board without being adversely affected by variations in the contour dimensions of the light-emitting elements. It is thus possible to produce a light-emitting-element array whose centers of light-emitting areas are spaced at accurate intervals, through a simple operation and arrangement.

According to the present invention, the light-emitting area of the light-emitting element is imaged while light is being emitted from the light-emitting area, and the center of gravity of the area of a binary image converted from the captured image is calculated and regarded as the center of the light-emitting area of the light-emitting element. Consequently, the center of the light-emitting area of each of light-emitting elements can reliably and highly accurately be positioned in place on the board without being adversely affected by variations in the contour dimensions of the light-emitting elements. It is thus possible to produce a light-emitting-element array whose centers of light-emitting areas are spaced at accurate intervals, through a simple process.

The pixels of a captured image of the light-emitting area of the light-emitting element which is captured while light is being emitted from the light-emitting area are weighted depending on their brightness values, and the center of gravity of the area of a binary image converted from the captured image is calculated and regarded as the center of the light-emitting area of the light-emitting element, for thereby offering the same advantages as those described above.

According to the present invention, furthermore, the distance of the board holding means for holding the board or the light-emitting-element holding means for holding the light-emitting element from the bonding position is directly measured by laser beams, so that the light-emitting element can be positioned highly accurately with respect to the light-emitting element. The accuracy of intervals or distances between light-emitting elements bonded on the board can thus effectively be increased.

Although certain preferred embodiments of the present invention have been shown and described in detail, it should be understood that various changes and modifications may be made therein without departing from the scope of the appended claims.

What is claimed is:

1. A method of bonding a light-emitting element on a board, said method comprising:

provided an array of joined chips, one of said chips serving as a light-emitting chip and the other chips serving as attractable chips for holding said light-emitting chip;

determining a desired bonding position on said board whereat said array is to be bonded;

causing said light-emitting chip to emit light;

determining a center of a light-emitting area of said light-emitting chip from an image of said emitted light;

determining coordinates of a contour reference point of said light-emitting chip with respect to coordinates of said center of the light-emitting area;

positioning said array in said desired bonding position based on the coordinates of the contour reference point; and bonding said array on said board whereby the center of said light emitting area is located at said desired bonding position.

2. A method according to claim 1, further comprising the step of:

measuring a distance of a board holding means for holding the board, or light-emitting-element holding means for holding the light-emitting element, from said bonding position, wherein a laser beam is used for said measuring.

3. A method of bonding a light-emitting element on a board, said method comprising:

determining a desired bonding position on said board whereon said light-emitting element is to be bonded;

capturing an image of a light-emitting area of said light-emitting element while light is being emitted from said light-emitting element;

converting the captured image of the light-emitting area into a binary image;

calculating the center of gravity of said binary image and regarding the calculated center of gravity as the center of the light-emitting area of said light-emitting element;

positioning said light-emitting element at said desired bonding position based on the center of gravity of the light-emitting area;

bonding said light-emitting element on said board, whereby the center of gravity of said light emitting area is located at said desired bonding position; and contacting a probe to an electrode of said light-emitting element to cause said light-emitting element to emit light;

removing a shadow of said probe from the captured image of the light-emitting area.

4. A method according to claim 3, wherein a brightness value of a predetermined number of pixels is used as a threshold for converting the captured image of the light-emitting area into the binary image, wherein said predetermined number of pixels are chosen from pixels of the captured image having the highest brightness.

5. A method according to claim 3, further comprising the step of:

measuring a distance of a board holding means for holding the board, or light-emitting-element holding means for holding the light-emitting element, from said bonding position, wherein a laser beam is used for said measuring.

6. A method of bonding a light-emitting element on a board, said method comprising the steps of:

determining a desired bonding position on said board whereon said light-emitting element is to be bonded;

capturing an image of a light-emitting area of said light-emitting element while light is being emitted from said light-emitting element;

weighting pixels of the captured image of the light-emitting area depending on brightness values thereof;

calculating a center of gravity of said captured image based on the weighted pixels, and regarding the calculated center of gravity as a center of the light-emitting area of said light-emitting element;

positioning said light-emitting element at said desired bonding position based on the center of gravity of the light-emitting area; and bonding said light-emitting element on said board, whereby the center of gravity of said light emitting area is located at said desired bonding position.

7. A method according to claim 6, further comprising the steps of:

contacting a probe to an electrode of said light-emitting element to cause said light-emitting element to emit light;

removing a shadow of said probe from the captured image of the light-emitting area.

8. A method according to claim 6, further comprising the step of:

measuring a distance of a board holding means for holding the board, or light-emitting-element holding means for holding the light-emitting element, from said bonding position, wherein a laser beam is used for said measuring.

9. An apparatus for bonding an array of joined chips at a predetermined position on a board, wherein one of said chips is operable to serve as a light-emitting chip and the other chips are operable to serve as attractable chips for holding said light-emitting chip, said apparatus comprising:

a light emitter operable to cause said light-emitting chip to emit light before the array of chips is bonded;

imaging device operable to determine a center of a light-emitting area of said light-emitting chip and further operable to determine coordinates of a contour reference point of said light-emitting chip with respect to coordinates of the center of the light-emitting area; and holder operable to position said array of chips in a bonding position on said board based on the coordinates of the contour reference point.

10. An apparatus according to claim 9, further comprising:

actuator operable to move said light emitter and said light-emitting-element holder back and forth in directions transverse to an optical axis of said imaging device.

11. An apparatus according to claim 9, further comprising:
a laser distance measuring mechanism operable to measure the distance of a board holder operable to hold the board or said light-emitting-element holder from said bonding position.

12. A method of bonding a plurality of light-emitting devices to a surface with a high degree of accuracy, said method comprising the steps of:
  a. providing said surface onto which it is desired to attach said light emitting devices;
  b. determining a respective desired position on said surface for each of said light emitting devices;
  c. aligning one of said light emitting devices with respect to an imaging device;
  d. calculating a position correction value for said light emitting device;
  e. comparing said correction value to a reference value and, adjusting a position of said light emitting device if said correction value is greater than said reference value;
  f. contacting a probe to said light emitting device causing said light emitting device to emit light;
  g. generating an image of a center area of said light emitting device with said imaging device based on said emitted light;
  h. determining coordinates of a center of said light emitting device based on said image;
  i. using said coordinates of the center of said light emitting device to position said surface such that said center of said light emitting device aligns with the respective desired bonding position on said surface, wherein said respective bonding position corresponds to said light emitting device;
  j. attaching said light emitting device to said surface at said position; and
  k. repeating steps c through j until a light emitting device has been bonded to said surface at each of said desired bonding positions.

* * * * *

UNITED STATES PATENT AND TRADEMARK OFFICE
CERTIFICATE OF CORRECTION

PATENT NO. : 6,208,419 B1
DATED : March 27, 2001
INVENTOR(S) : Kiyohumi Yamamoto, Hiroshi Maeda, Satoshi Mino and Kazuhiro Nishida It is certified that error appears in the above-identified patent and that said Letters Patent is hereby corrected as shown below:

Title page, item [30],
Foreign Application Priority Data should read --

Nov. 18, 1998 (JP) .................................................. 10-328111
Feb. 26, 1999 (JP) .................................................. 11-050901
Mar. 29, 1999 (JP) .................................................. 11-087084

Signed and Sealed this

Sixteenth Day of October, 2001

Attest:

NICHOLAS P. GODICI
Attesting Officer  *Acting Director of the United States Patent and Trademark Office*